(12) United States Patent
Song

(10) Patent No.: US 12,366,967 B2
(45) Date of Patent: Jul. 22, 2025

(54) DATA MASKING FOR PULSE AMPLITUDE MODULATION

(71) Applicant: Micron Technology, Inc., Boise, ID (US)

(72) Inventor: Keun Soo Song, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/768,944

(22) Filed: Jul. 10, 2024

(65) Prior Publication Data

US 2024/0361914 A1    Oct. 31, 2024

Related U.S. Application Data

(62) Division of application No. 17/821,594, filed on Aug. 23, 2022, now Pat. No. 12,073,084.

(60) Provisional application No. 63/239,673, filed on Sep. 1, 2021.

(51) Int. Cl.
G06F 3/06    (2006.01)

(52) U.S. Cl.
CPC .......... *G06F 3/0613* (2013.01); *G06F 3/0629* (2013.01); *G06F 3/0673* (2013.01)

(58) Field of Classification Search
CPC ..... G06F 3/0613; G06F 3/0629; G06F 3/0673
USPC ........................................................ 711/154
See application file for complete search history.

(56) References Cited

U.S. PATENT DOCUMENTS

| | | | |
|---|---|---|---|
| 11,108,604 B2 | 8/2021 | Lee et al. | |
| 11,587,598 B2 * | 2/2023 | Um | G11C 7/1084 |
| 12,073,084 B2 | 8/2024 | Song | |
| 2010/0180143 A1 | 7/2010 | Ware et al. | |
| 2012/0099383 A1 | 4/2012 | Si-hong et al. | |
| 2016/0211028 A1 | 7/2016 | Berman et al. | |
| 2019/0108864 A1 | 4/2019 | Hollis | |
| 2019/0199560 A1 | 6/2019 | Bossard et al. | |
| 2021/0175968 A1 | 6/2021 | Wu | |

(Continued)

FOREIGN PATENT DOCUMENTS

| | | |
|---|---|---|
| WO | 2020073300 | 4/2020 |
| WO | 2023034707 | 3/2023 |

OTHER PUBLICATIONS

"International Preliminary Report on Patentability", Application No. PCT/US2022/075403, Mar. 5, 2024, 7 pages.

(Continued)

*Primary Examiner* — Christopher B Shin
(74) *Attorney, Agent, or Firm* — Colby Nipper PLLC

(57) ABSTRACT

This document describes apparatuses and techniques for implementing data masking with pulse amplitude modulation (PAM) encoded signals of a memory circuit. In various aspects, a data mask function of a memory controller may use an unassigned or prohibited PAM signaling state for a set of data lines to indicate data masking to a memory device for a group of data bits. For example, the data mask function may alter a PAM symbol or signal level for at least one data line from a low-voltage state (L) or mid-voltage state (M) state to a high-voltage state (H), resulting in a PAM signaling state for the set of data lines that corresponds data mask indication for the group of data bits. By so doing, the data mask function may indicate data masking for the group of bits without a dedicated data mask signal line, which may enable improved per-line memory bandwidth.

20 Claims, 12 Drawing Sheets

(56) References Cited

U.S. PATENT DOCUMENTS

| | | |
|---|---|---|
| 2021/0293883 A1 | 9/2021 | Onuma et al. |
| 2021/0303428 A1 | 9/2021 | Onuma |
| 2022/0076716 A1 | 3/2022 | Um et al. |
| 2022/0121582 A1 | 4/2022 | Jin et al. |
| 2022/0166654 A1* | 5/2022 | Bossard .................. H04L 27/04 |
| 2022/0190936 A1 | 6/2022 | Jin et al. |
| 2022/0350512 A1 | 11/2022 | Spirkl et al. |
| 2023/0057441 A1 | 2/2023 | Spirkl et al. |
| 2023/0060813 A1 | 3/2023 | Song |
| 2023/0362041 A1 | 11/2023 | Nir |
| 2024/0073081 A1 | 2/2024 | Yang et al. |

OTHER PUBLICATIONS

"International Search Report and Written Opinion", Application No. PCT/US2022/075403, Dec. 6, 2022, 10 pages.
"Notice of Allowance", U.S. Appl. No. 17/821,594, May 7, 2024, 8 pages.
"Restriction Requirement", U.S. Appl. No. 17/821,594, Feb. 16, 2024, 6 pages.

* cited by examiner

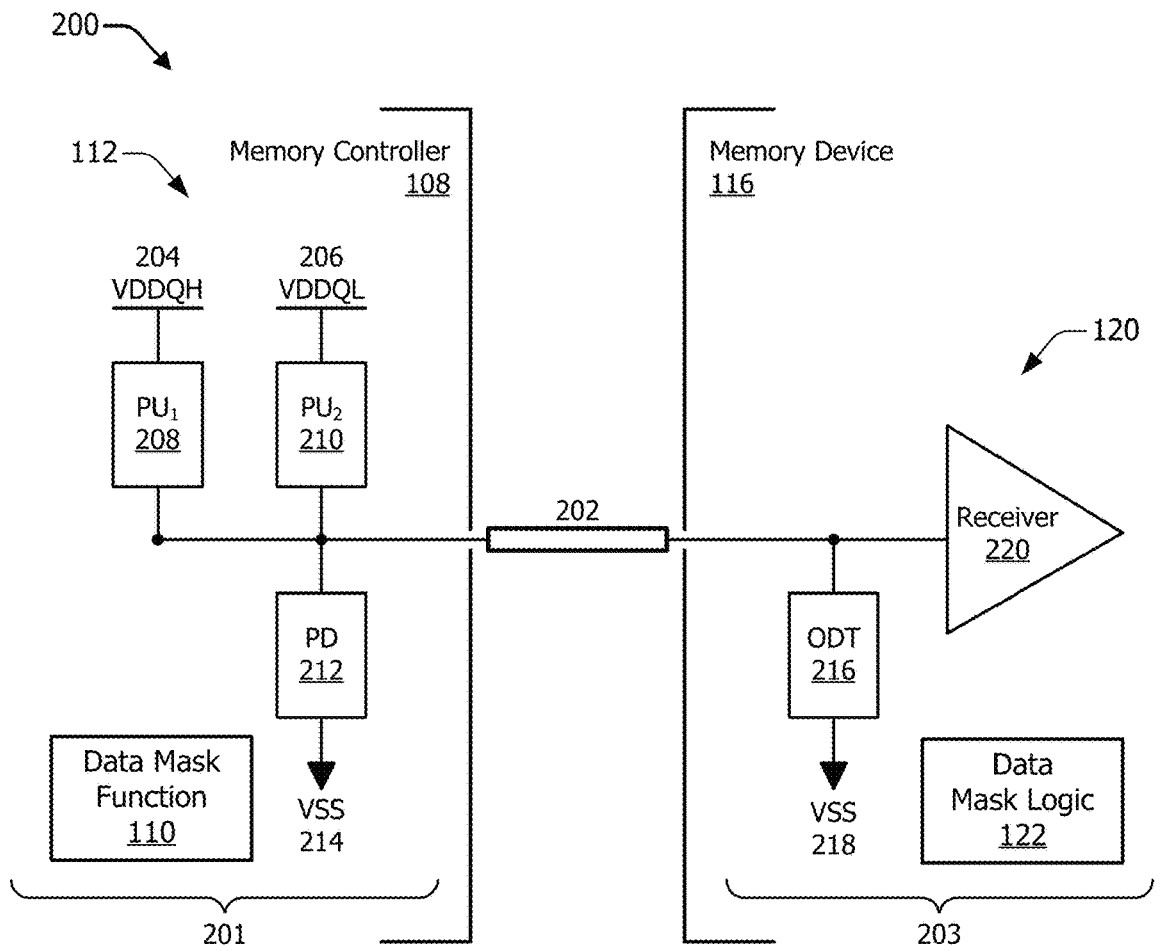
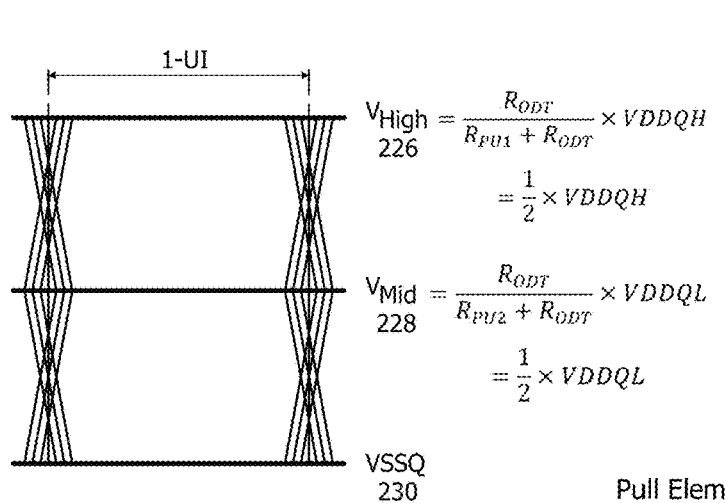
Fig. 2A

300 ⟶

NRZ Encodings 302

| | 3 Wires Binary | | |
|---|---|---|---|
| Value | B0 | B1 | B2 |
| 0 | 0 | 0 | 0 |
| 1 | 0 | 0 | 1 |
| 2 | 0 | 1 | 0 |
| 3 | 1 | 0 | 0 |
| 4 | 0 | 1 | 1 |
| 5 | 1 | 0 | 1 |
| 6 | 1 | 1 | 0 |
| 7 | 1 | 1 | 1 |

PAM3 Encodings 304

| | 2 Wires Tri-Level | |
|---|---|---|
| Value | P0 | P1 |
| 0 | L | L |
| 1 | M | L |
| 2 | L | M |
| 3 | M | M |
| 4 | H | M |
| 5 | M | H |
| 6 | H | L |
| 7 | L | H |
| DM | H | H |

| | | Burst Length (BL) 404 | | | | | | | | | | | | | | | | |
|---|---|---|---|---|---|---|---|---|---|---|---|---|---|---|---|---|---|---|
| | NRZ | 0 | 1 | 2 | 3 | 4 | 5 | 6 | 7 | 8 | 9 | 10 | 11 | 12 | 13 | 14 | 15 | |
| DQ | 0 | 0 | 8 | 16 | 24 | 32 | 40 | 48 | 56 | 64 | 72 | 80 | 88 | 96 | 104 | 112 | 120 | 144b |
| | 1 | 1 | 9 | 17 | 25 | 33 | 41 | 49 | 57 | 65 | 73 | 81 | 89 | 97 | 105 | 113 | 121 | |
| | 2 | 2 | 10 | 18 | 26 | 34 | 42 | 50 | 58 | 66 | 74 | 82 | 90 | 98 | 106 | 114 | 122 | |
| | 3 | 3 | 11 | 19 | 27 | 35 | 43 | 51 | 59 | 67 | 75 | 83 | 91 | 99 | 107 | 115 | 123 | |
| | 4 | 4 | 12 | 20 | 28 | 36 | 44 | 52 | 60 | 68 | 76 | 84 | 92 | 100 | 108 | 116 | 124 | |
| | 5 | 5 | 13 | 21 | 29 | 37 | 45 | 53 | 61 | 69 | 77 | 85 | 93 | 101 | 109 | 117 | 125 | |
| | 6 | 6 | 14 | 22 | 30 | 38 | 46 | 54 | 62 | 70 | 78 | 86 | 94 | 102 | 110 | 118 | 126 | |
| | 7 | 7 | 15 | 23 | 31 | 39 | 47 | 55 | 63 | 71 | 79 | 87 | 95 | 103 | 111 | 119 | 127 | |
| DMI | 0 | 0 | 1 | 2 | 3 | 4 | 5 | 6 | 7 | 8 | 9 | 10 | 11 | 12 | 13 | 14 | 15 | 256-prefetch + 32 DM bit |
| DQ | 8 | 128 | 136 | 144 | 152 | 160 | 168 | 176 | 184 | 192 | 200 | 208 | 216 | 224 | 232 | 240 | 248 | 144b |
| | 9 | 129 | 137 | 145 | 153 | 161 | 169 | 177 | 185 | 193 | 201 | 209 | 217 | 225 | 233 | 241 | 249 | |
| | 10 | 130 | 138 | 146 | 154 | 162 | 170 | 178 | 186 | 194 | 202 | 210 | 218 | 226 | 234 | 242 | 250 | |
| | 11 | 131 | 139 | 147 | 155 | 163 | 171 | 179 | 187 | 195 | 203 | 211 | 219 | 227 | 235 | 243 | 251 | |
| | 12 | 132 | 140 | 148 | 156 | 164 | 172 | 180 | 188 | 196 | 204 | 212 | 220 | 228 | 236 | 244 | 252 | |
| | 13 | 133 | 141 | 149 | 157 | 165 | 173 | 181 | 189 | 197 | 205 | 213 | 221 | 229 | 237 | 245 | 253 | |
| | 14 | 134 | 142 | 150 | 158 | 166 | 174 | 182 | 190 | 198 | 206 | 214 | 222 | 230 | 238 | 246 | 254 | |
| | 15 | 134 | 143 | 151 | 159 | 167 | 175 | 183 | 191 | 199 | 207 | 215 | 223 | 231 | 239 | 247 | 255 | |
| DMI | 1 | 0 | 1 | 2 | 3 | 4 | 5 | 6 | 7 | 8 | 9 | 10 | 11 | 12 | 13 | 14 | 15 | |

| | | | | | | | | | BL | | | | | | | | | DQ |
|---|---|---|---|---|---|---|---|---|---|---|---|---|---|---|---|---|---|---|
| | Signal Level | 0 | 1 | 2 | 3 | 4 | 5 | 6 | 7 | 8 | 9 | 10 | 11 | 12 | 13 | 14 | 15 | |
| 0 | H,M,L | L | H | H | L | M | L | L | | | | | | | | | | |
| 1 | H,M,L | L | L | H | L | M | M | L | | | | | | | | | | 144b |
| 2 | H,M,L | L | H | H | L | M | L | L | | | | | | | | | | |
| 3 | H,M,L | L | L | H | H | M | H | H | | | | | | | | | | |
| 4 | H,M,L | L | H | L | L | M | M | H | | | | | | | | | | |
| 5 | H,M,L | L | L | L | L | H | H | H | | | | | | | | | | |
| DM | # of 'H' | 0 | 3 | 4 | 1 | 1 | 2 | 5 | 0 | 0 | 0 | 0 | 0 | 0 | 0 | 0 | 0 | |
| Function | DM0 = enabled | No | No | Yes | No | No | No | Yes | | | | | | | | | | |
| 6 | H,M,L | L | H | M | H | H | H | H | | | | | | | | | | |
| 7 | H,M,L | H | L | L | H | M | M | H | | | | | | | | | | 144b |
| 8 | H,M,L | H | H | L | L | M | H | H | | | | | | | | | | |
| 9 | H,M,L | H | M | M | M | M | M | H | | | | | | | | | | |
| 10 | H,M,L | L | H | L | L | L | H | H | | | | | | | | | | |
| 11 | H,M,L 506 | H | L | L | L | L | L | L | | | | | | | | | | |
| DM | # of 'H' | 4 | 3 | 0 | 1 | 1 | 0 | 0 | 0 | 0 | 0 | 0 | 0 | 0 | 0 | 0 | 0 | |
| Function | DM1 = enabled | Yes | No | No | No | No | No | No | | | | | | | | | | |

500 —

502, 504, 508, 510, 512

DM Configuration 1 521: # of "H" > 3 indicates Data Masking of DQ[0:5]
DM Configuration 2 522: # of "H" == 4 indicates Data Masking of DQ[0:5]
DM Configuration 3 523: # of "H" == 5 indicates Data Masking of DQ[0:5]
DM Configuration 4 524: # of "H" == 6 indicates Data Masking of DQ[0:5]

DM Configuration 1 531: # of "H" > 3 indicates Data Masking of DQ[6:11]
DM Configuration 2 532: # of "H" == 4 indicates Data Masking of DQ[6:11]
DM Configuration 3 533: # of "H" == 5 indicates Data Masking of DQ[6:11]
DM Configuration 4 534: # of "H" == 6 indicates Data Masking of DQ[6:11]

| Signal Level | 0 | 1 | 2 | 3 | 4 | 5 | 6 | 7 | 8 | 9 | 10 | 11 | 12 | 13 | 14 | 15 | DQ |
|---|---|---|---|---|---|---|---|---|---|---|---|---|---|---|---|---|---|
| 0 | H,M,L | L | H | L | M | L | H | | | | | | | | | | |
| 1 | H,M,L | L | L | L | L | M | L | | | | | | | | | | 144b |
| 2 | H,M,L | L | H | H—602 | M | M | H | | | | | | | | | | |
| 3 | H,M,L | L | L | H | M | M | H | | | | | | | | | | |
| 4 | H,M,L | L | H | L—604 | M | L | H | | | | | | | | | | |
| 5 | H,M,L | L | L | L | H | L | H | | | | | | | | | | |
| DM Function DM0 = EN | No | No | Yes | No | No | No—606 / Yes—608 | | | | | | | | | | | |
| 6 | H,M,L | H | H | H | H | H | H | | | | | | | | | | |
| 7 | H,M,L | H—610 | H | L | M | M | H | | | | | | | | | | 144b |
| 8 | H,M,L | H | M | L | M | L | L | | | | | | | | | | |
| 9 | H,M,L | H | M | M | M | L | L | | | | | | | | | | |
| 10 | H,M,L | L | H | M | M | H | L | | | | | | | | | | |
| 11 | H,M,L | H | L | L | L | L | L | | | | | | | | | | |
| DM Function DM1 = EN | Yes—612 | No | No | No | No | No | | | | | | | | | | | |

DM Configuration 1 621: Within DQ[0:1] # of "H" == 2 indicates Data Masking of DQ[0:5]
DM Configuration 2 622: Within DQ[2:3] # of "H" == 2 indicates Reserved for DQ[0:5]
DM Configuration 3 623: Within DQ[5:6] # of "H" == 2 indicates Reserved for DQ[0:5]

DM Configuration 1 631: Within DQ[6:7] # of "H" == 2 indicates Data Masking of DQ[6:11]
DM Configuration 2 632: Within DQ[8:9] # of "H" == 2 indicates Reserved for DQ[6:11]
DM Configuration 3 633: Within DQ[10:11] # of "H" == 2 indicates Reserved for DQ[6:11]

DATA MASKING FOR PULSE AMPLITUDE MODULATION

CROSS-REFERENCE TO RELATED APPLICATIONS

This application is a divisional of and claims priority to U.S. Nonprovisional application Ser. No. 17/821,594, filed Aug. 23, 2022, which in turn claims the benefit of U.S. Provisional Application No. 63/239,673, filed Sep. 1, 2021, the disclosures of which are hereby incorporated by reference in their entirety.

BACKGROUND

Computers, smartphones, and other electronic devices operate using processors and memories. A processor enables a device to run applications and programs by executing a set of instructions that process data. Generally, the processor obtains the set of instructions and data from a memory that stores this information. Advances in processor capabilities have often outpaced those of memory. This outpacing, along with many demands on memory devices, results in processor execution speeds that are often limited by the bandwidth or latency of memories. Further, manufacturers of memories or electronic devices may face demands for faster execution speeds of memories while also reducing power consumption. Accommodating these various demands for memory performance and power conservation result in numerous constraints on data signaling parameters to ensure reliable memory operation under increasing demands and power limitations.

BRIEF DESCRIPTION OF THE DRAWINGS

Apparatuses of and techniques for data masking for pulse amplitude modulation are described with reference to the following drawings. The same numbers are used throughout the drawings to reference like features and components:

FIG. 2A illustrates example configurations of pulse amplitude modulation circuits that can be implemented in a host device, memory controller, or memory device in accordance with one or more aspects;

FIG. 3 illustrates an example of pulse amplitude modulation symbol bit mapping in accordance with one or more aspects;

FIG. 4A illustrates an example binary signaling bit map with dedicated data mask bits for a burst write operation;

FIG. 5 illustrates an example pulse amplitude modulation signal level map in which data masking can be implemented in accordance with one or more aspects;

FIG. 6 illustrates another example pulse amplitude modulation signal level map in which data masking can be implemented in accordance with one or more aspects;

DETAILED DESCRIPTION

Overview

Figure 1:
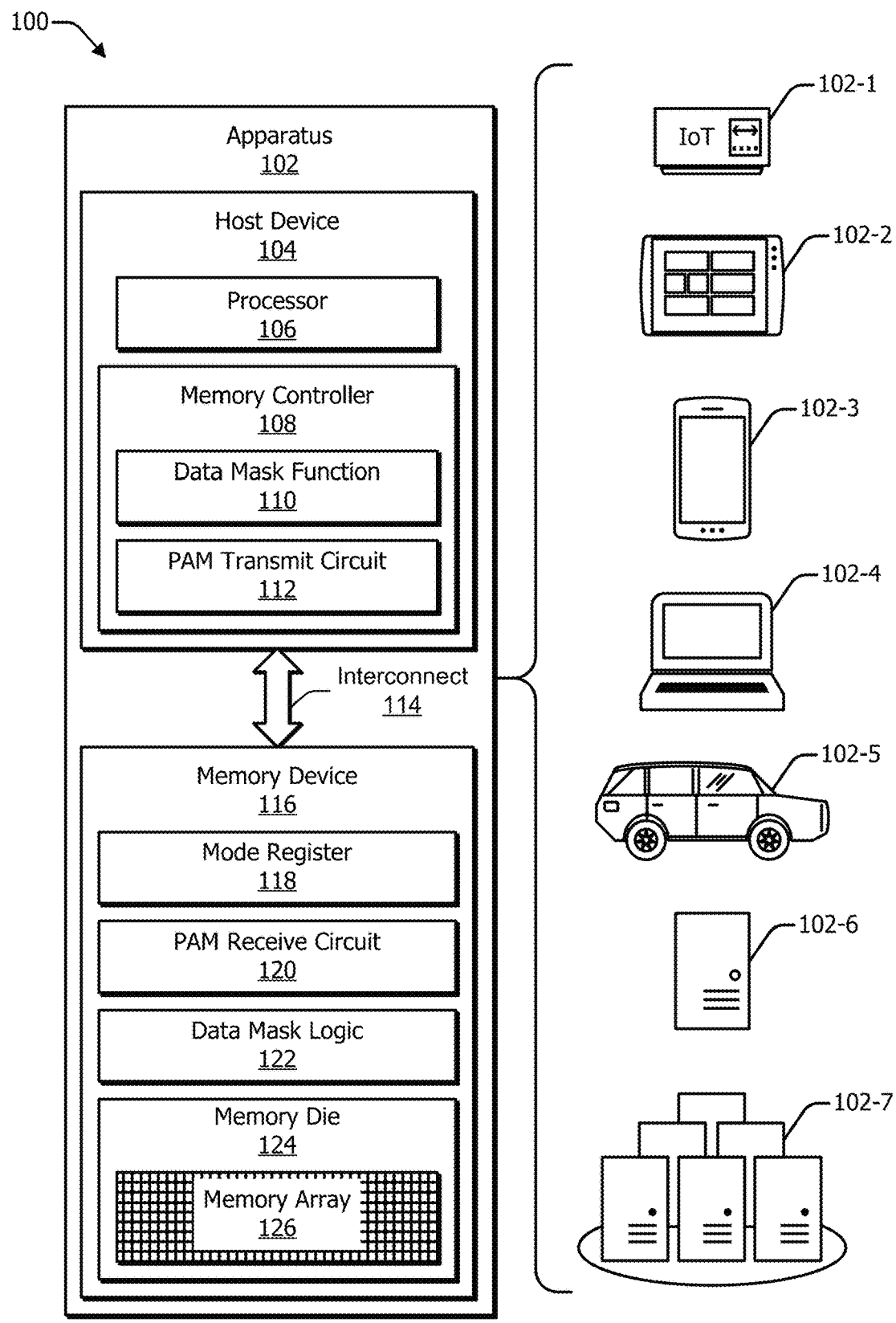
FIG. 1 illustrates an apparatus in which aspects of data masking for pulse amplitude modulation can be implemented for a memory system.

Computers, smartphones, and other electronic devices operate using processors and memories to run a variety of programs and applications, ranging from low-power operating systems and background utilities to computationally intensive applications for high-resolution graphics, computational simulations, artificial intelligence (AI), and so forth. Execution speeds associated with these programs and applications are often related to the performance of a memory of the device, which is contingent, in part, on a frequency of clock signals and data encoding schemes used to enable and coordinate operation of the memory.

By way of review, a memory system operates based on clock and input/output (I/O) signals by which data is transferred between a memory controller and the memory device. To increase data transfer rates or bandwidth to improve system performance or capability, the memory controller can increase clocking and related I/O speed of the memory device. Increasing I/O speed of the memory device, however, consumes additional power, which can be an important factor for run times or battery life of mobile devices. As an alternative to increasing I/O speed, some systems may increase I/O bandwidth by implementing pulse amplitude modulation (PAM) signaling, which transmits multiple data bits over a signal line (e.g., data line) in a single clock cycle. Thus, PAM signaling may enable an increased I/O bandwidth at a lower I/O speed than non-return-to-zero (NRZ) signaling. Mapping data bits from a binary interface to some PAM signaling schemes, however, may not fully utilize all available signaling states of the PAM signaling scheme or PAM symbol map. As such, the use of PAM signaling may improve I/O bandwidth over binary signaling, yet still suffer from inefficiencies associated with an unused, invalid, or undefined signaling state.

To address these and other issues associated with PAM signaling in memory circuits, this document describes aspects of data masking for pulse amplitude modulation. Various aspects, example circuits, memory devices, memory controllers, and methods are described herein for implementing data masking with PAM encoded signals of a memory circuit that may utilize unassigned or prohibited (e.g., for data values) PAM signaling states for other purposes. In various aspects, a data mask function of a memory controller may use an unassigned or prohibited PAM signaling state for a set of data lines to indicate data masking to a memory device for a corresponding group of data bits. For example, the data mask function may alter a PAM symbol or signal level for one or more data lines from a low-voltage state (L) or mid-voltage state (M) state to a high-voltage state (H), resulting in a PAM signaling state (e.g., majority of H values) for the set of data lines that corresponds to an indication of data masking for the group data bits (e.g., a burst length of bits). Alternatively, the data mask function may alter one or two PAM signal levels or symbols for a pair of data lines (e.g., DQ[0:1]) that correspond to the group of data bits, such as a byte of data for a unit interval that corresponds to DQ[0:5]. By so doing, the data mask function may indicate data masking for the group of bits without a dedicated data mask signal line, which may enable improved per-line memory bandwidth. These are but a few examples of data masking for pulse amplitude modulation, others of which are described throughout this disclosure.

Example Operating Environments

FIG. 1 illustrates at 100 an apparatus 102 in which aspects of data masking for pulse amplitude modulation signaling in memory circuits can be implemented. The apparatus 102 can include, for example, an internet-of-things (IoT) device 102-1, tablet device 102-2, smartphone 102-3, notebook computer 102-4, an automobile 102-5, server computer 102-6, server cluster 102-7 that may be part of cloud computing infrastructure or a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), a graphics processor unit (GPU) card, desktop computer, motherboard, server blade, consumer appliance, public transportation device, drone, industrial equipment, security device, sensor, or an electronic component thereof. These example configurations of apparatus 102 can include one or more components to provide various computing functionalities, data processing, and/or features.

In the example implementations shown at 100, the apparatus 102 may include a host device 104 with at least one processor 106 and at least one memory controller 108. The apparatus 102 can be implemented in various manners with more, fewer, or different components. For example, the host device 104 may include multiple cache memories (e.g., including multiple levels of cache memory) associated with the processor 106 and/or the memory controller 108 or no cache memory. In other implementations, the host device 104 may omit the processor 106 or the memory controller 108. In addition to one or more cache memories, the host device 104 can include any of the illustrated components and/or additional components to form a system-on-a-chip (SoC).

The processor 106 may be implemented as any suitable type of processor, which may include a general-purpose processor, one or more processing cores, a central processing unit (CPU), a graphics processing unit (GPU), a neural network engine or accelerator, an application-specific integrated circuit (ASIC), a field-programmable gate array (FPGA) integrated circuit (IC), a communications processor (e.g., a modem or baseband processor), or the like. In operation, the memory controller 108 can provide a high-level or logical interface between the processor 106 and at least one memory (e.g., a memory array or external memory) that is coupled to the host device 104 using a respective interconnect. The memory controller 108 can, for example, receive memory requests from the processor 106 and provide the memory requests to a memory array with appropriate formatting, encoding, modulation, timing, and reordering in accordance with a memory access protocol or specification, which may include a Low-Power Double Data Rate 5 (LPDDR5) specification or a Low-Power Double Data Rate 6 (LPDDR6) specification. For example, the memory controller 108 may implement non-return-to-zero (NRZ) modulation, three-level pulse amplitude modulation (PAM3), four-level pulse amplitude modulation (PAM4), or the like. To facilitate processor memory access, the memory controller 108 may forward or return memory responses received from the memory array to the processor 106.

The memory controller 108 depicted in 100 includes data mask function 110 and a pulse amplitude modulation-capable transmit circuit 112 (PAM transmit circuit 112). Generally, the PAM transmit circuit 112 may represent at least a portion of a transceiver circuit capable of implementing PAM signaling (e.g., PAM3 signaling) and/or binary signaling (e.g., NRZ signaling). A memory interconnect 114 operably couples the host device 104 (e.g., via host interface) or the memory controller 108 to a memory device 116 (e.g., via an interface to the interconnect). In aspects, the data mask function 110 implements data masking for pulse amplitude modulation encoded data by controlling or altering parameters of signaling between the memory controller 108 and the memory device 116. For example, the data mask function 110 may monitor, detect, and/or selectively alter modulation symbols, bit values, encoding, signal levels, or signaling states that correspond to various data or commands communicated between the memory controller 108 and memory device 116 coordinate and execute transfers of data or other information. For example, the memory controller 108 may configure the memory device 116 to operate in an NRZ signaling mode or a signaling PAM mode for executing data transfers over the interconnect 114. Based on the selected PAM signaling mode, the data mask function 110 may implement aspects of data masking for pulse amplitude modulation as described throughout this disclosure. These and other capabilities of the data mask function 110 may be used to implement aspects of data masking for pulse amplitude modulation, examples of which are described herein.

To facilitate a selected signaling mode, the memory controller 108 can configure, for the memory controller 108 and/or the memory device 116, respective clock circuits (e.g., frequencies), transmit circuits, receive circuits, and/or termination circuits (e.g., on-die terminations (ODTs)) for signal lines of the interconnect 114. In aspects, the memory controller 108 configures, via control circuitry (not shown), the PAM transmit circuit 112 and/or ODTs of the memory controller 108 to provide various termination configurations (e.g., impedance and/or voltage) for the signal lines of the interconnect 114 to support various signaling modes (e.g., PAM3 or NRZ) and/or interconnect configurations.

The memory device 116, which is coupled to the host device 104 using the interconnect 114, can be implemented as any suitable type of memory module, memory die, memory array, memory circuit, or the like. Examples of the memory device 116 include a DRAM package or module (e.g., an LPDDR synchronous DRAM (SDRAM)). The DRAM package or module can include a three-dimensional (3D) stacked DRAM device, a high-bandwidth memory (HBM) device, or a hybrid memory cube (HMC) device. In general, there are multiple types of DRAM. As one example, a low-power double data rate (DDR) memory, also referred to as LPDDR or mobile DDR, is a DDR SDRAM. LPDDR generally uses less power than other types of DDR SDRAM. In some applications, an SDRAM memory, an LPDDR memory, or other memory may be configurable to operate using different combinations of signaling mode, operating frequency, and operating voltage for scalable performance to support applications or memory access profiles that range from low-power, moderate, or memory intensive.

As shown in 100, the memory device 116 may include or be implemented with a mode register 118 (or a registered clock driver (RCD)), PAM receive circuit 120, data mask logic 122, and one or more memory dies 124 that include a respective memory array 126. In some cases, the memory array 126 includes memory cells organized into one or more memory banks. While the data mask function 110 is depicted in 100 as part of the host device 104, in general, this entity (or a portion thereof) can be implemented as a component of the apparatus 102, interconnect 114, the memory device 116, or mode register 118 of the memory device 116. Generally, the memory device 116 can also perform operations to, for example, communicate with the memory controller 108 and perform memory read or write operations using various components of the mode register 118, control circuitry (not shown), PAM receive circuit 120, and/or memory die 124.

The mode register 118 of the memory device 116 may receive commands from the memory controller 108 to control or configure various operating parameters of the memory device 116 or memory dies 124. For example, the mode register 118 may use the control circuitry to configure clock settings, power settings, termination settings, or the like for one or more memory dies 124 of the memory device 116. Though not depicted in FIG. 1, the control circuitry of the memory device 116 can include, for example, one or more registers, array control logic, clock circuitry, write-path circuitry, read path circuitry, and so forth. The control circuitry can also synchronize various memory components with one or more clock signals received from the memory controller 108, including a clock (CK) signal (e.g., a true CK (CK_t) or a complementary CK (CK_c)) or a write clock (WCK) signal (e.g., WCK_t or WCK_c). The control circuitry can additionally use an internal clock signal to synchronize memory components. The CK and/or WCK signals can be used to set a transfer rate of a command and address (CA) signal and a rate at which data (DQ) and data strobes (DQS) are transferred between a host device and the memory die 124. Alternatively or additionally, the control circuitry of the memory device 116 can generate read data strobe (RDQS) signals to provide a clock signal to internal logic of the memory controller 108 for receiving and decoding data responses received from the memory device 116 over a data (e.g., DQ) bus of the interconnect.

In aspects, the PAM receive circuit 120 of the memory device 116 includes resistive elements and respective switches (e.g., combined as on-die termination circuitry) to provide termination configurations (e.g., impedance and/or voltage) for signal lines of the interconnect 114 to support various signaling modes and/or interconnect configurations. For example, the PAM receive circuit 120 can include a gain amplifier and a pull-down termination to a ground reference or a pull-up termination to a power rail. The PAM receive circuit 120 may be operably coupled with the data mask logic 122, which may be configured to enable data masking for groups of data bits, data bytes, or burst lengths of data received from the memory controller 108. In some cases, the data mask logic 122 detects numbers, combinations, or sequences of PAM symbols that indicate data masking for PAM encoded data. These and other capabilities of the data mask logic 122 may be used to implement aspects of data masking for pulse amplitude modulation, examples of which are described herein.

The memory array 126 of the memory die 124 can include any suitable type or configuration of a memory circuit or memory cells, including but not limited to memory cells of DRAM, SDRAM, 3D-stacked DRAM, DDR memory, LPDRAM, or LPDDR SDRAM. For example, the memory array 126 can include memory cells of SDRAM configured as a memory module with one channel containing either 16 or 8 DQ signals, double-data-rate input/output (I/O) signaling, and support for a supply voltage. The density of the memory die 124 or memory array 126 can range, for instance, from 2 gigabits (Gb) to 32 Gb. The memory die 124 and/or memory device 116 may operate in accordance with a memory access protocol or specification, which may include an LPDDR5 specification or an LPDDR6 specification. The memory die 124, memory array 126, and the control circuitry may be components of a single semiconductor die or separate semiconductor dies. In some cases, the memory array 126 or the control circuitry are distributed across multiple memory dies 124 of the memory device 116.

The host device 104 can be operatively coupled, using the interconnect 114 of the apparatus 102, to a cache memory (not shown), which may be operatively coupled to the memory device 116. As shown in this example, the memory device 116 is connected to the host device 104 using the interconnect 114 without an intervening buffer or cache. The memory device 116 may also operatively couple to a storage memory (not shown) of the apparatus 102. The storage memory can include, for example, a storage-class memory device (e.g., a flash memory, hard disk drive, solid-state drive, phase-change memory (PCM), or memory employing 3D XPoint™). The host device 104 can be coupled, directly or indirectly, using the interconnect 114, to the memory device 116 and a storage memory. This interconnect 114 can transfer data between two or more components of the apparatus 102. Examples of the interconnects include a bus, switching fabric, and one or more signal lines that carry voltage or current signals. Though not illustrated, the interconnect 114 can include at least one command/address (CA) bus and at least one data (DQ) bus. Each bus may be a unidirectional or a bidirectional bus. In some implementations, an interconnect 114 may also include a chip-select (CS) I/O that can, for example, couple to one or more CS pins of the memory device 116. An interconnect 114 may also include a CK bus that is part of or separate from the CA bus.

Alternatively or additionally, the memory device 116 may have an "internal" or "local" cache memory for storing or buffering data for read and/or write operations. In some cases, the host device 104 and the memory device 116 can be disposed on, or physically supported by, a PCB (e.g., a rigid or flexible motherboard). The host device 104 and the memory device 116 may additionally be integrated on an IC or fabricated on separate ICs packaged together. The memory device 116 may also be coupled to multiple host devices 104 using one or more interconnects and may respond to memory requests from two or more host devices 104. Each host device 104 may include a respective memory controller 108, or the multiple host devices 104 may share a memory controller 108.

FIG. 2 illustrates at 200 configurations of pulse amplitude modulation circuits that can be implemented in a host device, memory controller, or memory device in accordance with one or more aspects. In this example configuration, a memory controller 108 is coupled to a memory device 116 by a data line 202 (e.g., DQ line) of a memory interconnect (e.g., interconnect 114) that extends between respective DQ terminals (e.g., pins or pads) of the memory controller 108 and the memory device 116. The memory controller 108 includes a data mask function 110, a PAM transmit circuit 112, and control circuitry (not shown) that enables the memory controller 108 to selectively operate the PAM transmit circuit 112 to enable PAM modulation of data or other information. In aspects, the memory controller 108 includes data path circuitry 201 that is configured to implement PAM signaling for data written to or read from the memory device 116, and to implement the data mask function 110. Thus, the data mask function 110 may represent a functional block or logic unit of the data path circuitry 201 of the memory controller 108. In some cases, the data mask function 110 is implemented by hardware-based circuitry, logic, register(s) or processor of the memory controller 108 to provide functionalities or implement operations described herein. Although not shown, the memory controller 108 may include other transceiver circuitry to enable receive functions or other types of signal modulation (NRZ).

In aspects, the memory controller 108 includes a power management integrated-circuit (PMIC, not shown) and a power distribution network (PDN, not shown) that distribute or route power provided by the PMIC to components of the memory device, including components of the PAM transmit circuit 112. In this example, the PMIC and PDN of the memory controller 108 provide power for circuitry of the memory controller at multiple levels, which are distributed by the PDN to respective power rails of the memory controller 108. The PMIC may supply power at a first I/O voltage 204 (e.g., VDDQH) and a second I/O voltage 206 (e.g., VDDQL) to support I/O operation (e.g., DQ line driving), which may enable the memory controller 108 to implement dual-voltage PAM signaling. In some cases, the first I/O voltage 204 (e.g., VDDQH, 1.0V) is approximately twice the second I/O voltage 206 (e.g., VDDQL, 0.5V) and/or approximately the same as a core supply voltage (VDD2H, 1.05V) of the memory controller.

The PAM transmit circuit 112 includes a first pull-up element 208 ($PU_1$ 208) coupled between the data line 202 and the VDDQH power rail 204, a second pull-up element 210 ($PU_2$ 210) coupled between the data line 202 and the VDDQL power rail 206, and a pull-down element 212 coupled between the data line 202 and a ground reference 214 (VSS 214). Alternatively, the pull-down element 212 or other pull-down elements or resistors described herein may be coupled to a node referenced to ground or a node configured to sink current to enable functionality of the pull-down element 212.

The first pull-up element 208 ($PU_1$ 208) or the second pull-up element 210 ($PU_2$ 210) may include a resistor and respective series switch to apply a pull-up impedance to the data line 202. For example, the pull-up elements 208, 210 may include a resistive element of any suitable value, which may range from 40Ω to 120Ω, with a respective series switch element coupled between the data line and the VDDQH power rail 204 or VDDQL power rail 206. Alternatively or additionally, the pull-down element 212 may include a resistive element of any suitable value, which may range from 40Ω to 120Ω, with a series switch element coupled between the data line and the VSS reference 214.

With reference to the memory device 116, the PAM receive circuit 120 includes an on-die termination 216 (ODT 216) coupled between the data line 202 and a ground reference 218, as well as a receiver amplifier 220 (receiver 220). In aspects, the memory device 116 includes data path circuitry 203 that is configured to implement PAM signaling for data written to or read from the memory device 116, and to implement the data mask logic 112. Thus, the data mask logic 112 may represent a functional block or logic unit of the data path circuitry 203 of the memory device 116. In some cases, the data mask logic 122 is implemented by hardware-based circuitry, logic, register, or processor of the memory device 116 to provide functionalities or implement operations described herein. When configured for PAM signaling, control circuitry of the memory device 116 may activate the ODT 216 to terminate the data line 202. Although not shown, an output of the receiver 220 (e.g., input buffer or gain amplifier) may be coupled to an equalizer, a decision feedback equalization (DFE) circuit, or de-serializer to receive DQ signals for data write operations to the memory device 116. In aspects, the data mask logic of the memory device 116 is operably coupled to the receiver 220 or other circuitry of a write path of the memory device. As described herein, the data mask logic 122 may monitor respective PAM symbols or signal levels of DQ lines of the interconnect 114 to implement data masking for pulse amplitude modulation.

In aspects, the memory controller 108 selectively activates the pull elements 208, 210, or 212 to implement PAM signaling level or PAM symbols. As noted, the transmit circuit 112 may be configured to implement dual voltage PAM signaling based on VDDQH and VDDQL. As shown at 222, for a given clock cycle or unit interval (UI), selective activation of the pull elements, such as based on a pull element activation table 224, enables the memory controller 108 to generate multi-level signals or symbols that include a high-level signal 226 (H), a mid-level signal 228 (H), and a low-level signal 230 (L). As indicated by the resistor divider formulas at 222, the high-level signal 226 may be approximately one half the voltage of VDDQH 204, and the mid-level signal 228 may be approximately one half the voltage of VDDQL 206. As described herein, the data mask function 110 may interact with control circuitry of the memory controller 108 to alter one or more signal levels or PAM symbols to implement data masking for pulse amplitude modulation. Example PAM symbols, signal levels, bit mappings, and aspects of data masking are described further with reference to FIGS. 3-10.

Figure 2B:
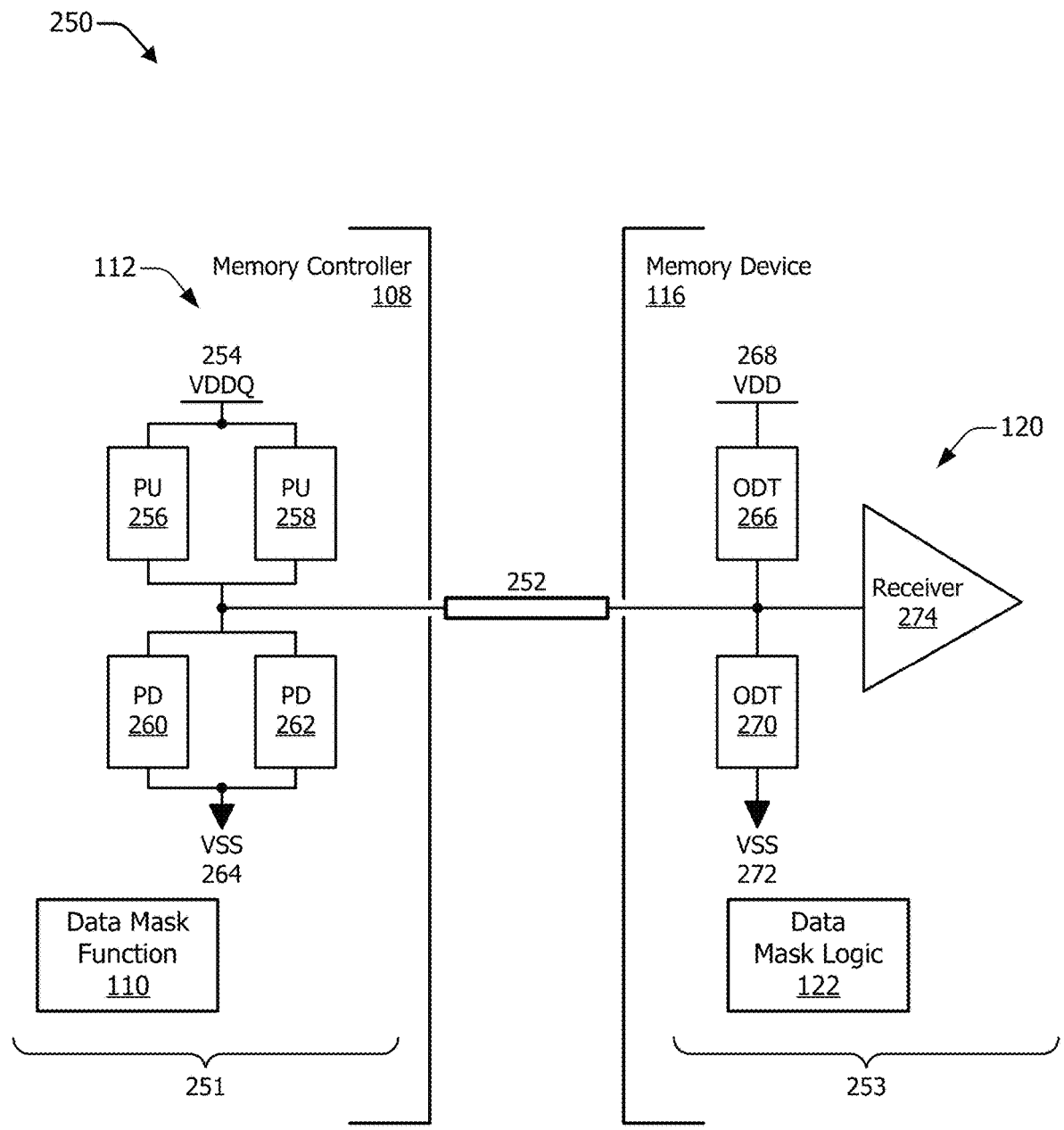
FIG. 2B illustrates other example configurations of pulse amplitude modulation circuits that can be implemented in a host device, memory controller, or memory device in accordance with one or more aspects.

FIG. 2B illustrates at 250 other example configurations of pulse amplitude modulation circuits that can be implemented in a host device, memory controller, or memory device in accordance with one or more aspects. For the sake of brevity, the memory controller 108 and/or memory device 116 of FIG. 2B may be configured similar to the respective entities of FIG. 2A unless described otherwise. Generally, the aspects described herein may be implemented with either and/or a combination of the example circuit configurations described with reference to FIG. 2A and FIG. 2B. In aspects, the memory controller 108 includes data path circuitry 251 that is configured to implement PAM signaling for data written to or read from the memory device 116, and to implement the data mask function 110. Thus, the data mask function 110 may represent a functional block or logic unit of the data path circuitry 251 of the memory controller 108. In some cases, the data mask function 110 is implemented by hardware-based circuitry, logic, register(s) or processor of the memory controller 108 to provide functionalities or implement operations described herein. In this example, a PMIC and PDN of the memory controller 108 are configured to provide a supply power with an I/O voltage 254 (e.g., VDDQ), from which the PAM transmit circuit 112 operates (e.g., single-voltage PAM signaling).

As shown at 250, the transmit circuit 112 of the memory controller 108 includes a first pull-up element 256 ($PU_1$ 256) coupled between the data line 202 and the VDDQ power rail 254 and a second pull-up element 258 ($PU_2$ 258) coupled between the data line 202 and the VDDQ power rail 254. The transmit circuit 112 also includes a first pull-down element 260 ($PD_1$ 260) and a second pull element 262 ($PD_2$ 262) coupled in parallel between the data line 202 and a ground reference 264 (VSS 264). The pull-up elements 256, 258 and/or pull-down elements 260, 262 may include one or more resistors and respective switches to apply a pull-up and/or pull-down impedance to the data line 202. For example, the pull-up elements 256, 258 may include two resistors in parallel (e.g., an 80∥80Ω configuration) with respective series switch elements coupled between the data line and the VDDQ power rail 254. Alternatively or additionally, the pull-down elements 260, 262 may include two resistors in parallel (e.g., an 80∥80Ω configuration) with respective series switch elements coupled between the data line and the VSS reference 250.

With reference to the memory device 116, the PAM receive circuit 120 may be implemented as part of a transceiver circuit and/or termination circuit of the memory device 116. In aspects, the memory device 116 includes data path circuitry 253 that is configured to implement PAM signaling for data written to or read from the memory device 116, and to implement the data mask logic 112. Thus, the data mask logic 112 may represent a functional block or logic unit of the data path circuitry 253 of the memory device 116. In some cases, the data mask logic 122 is implemented by hardware-based circuitry, logic, register, or processor of the memory device 116 to provide functionalities or implement operations described herein. In this example, the PAM receive circuit 120 includes an on-die termination 266 (ODT 266) coupled between the data line 202 and a termination power rail VDD 268 provided by a PMIC of the memory device. The PAM receive circuit 120 also includes an on-die termination 270 coupled between the data line 202 and a ground reference 272 of the memory device 116. In aspects, the ODT 266 and/or the ODT 270 may be circuitry of a receive, transmit, or termination circuit of the memory device 116. As such, the termination power rail VDD 268 may include any suitable voltage, such as an I/O line drive voltage (e.g., VDDQ, 0.5V) or a core voltage (e.g., VDD2H, 1.0V) of the memory device 116. Thus, in various PAM signaling modes as configured by the memory controller 108 or mode register 118, the PAM receive circuit 120 may terminate the data line 252 to either VDD 268 or VSS 272. A receiver 274 of the PAM receive circuit 120 may be coupled to an equalizer, a decision feedback equalization (DFE) circuit, or de-serializer to receive DQ signals from the memory controller. In aspects, the data mask logic of the memory device 116 is operably coupled to the receiver 220 or other circuitry of a write path of the memory device. As described herein, the data mask logic 122 may monitor respective PAM symbols or signal levels of DQ lines of the interconnect 114 to implement data masking for pulse amplitude modulation.

In aspects, the memory controller 108 selectively activates the pull elements 256, 258, 260, and/or 262 to implement PAM signaling level or PAM symbols. In aspects, for a given clock cycle or unit interval (UI), selective activation of the pull elements, such as based on a pull element activation table 276, enables the memory controller 108 to generate multi-level signals or symbols that include a high-level signal 278 (H), a mid-level signal 280 (H), and a low-level signal 282 (L). These signal levels may be similar to or different from those described with reference to FIG. 2A and/or may be dependent on an ODT setting of the PAM receive circuit 120 of the memory device 116. As described herein, the data mask function 110 may interact with control circuitry of the memory controller 108 to alter one or more signal levels or PAM symbols to implement data masking for pulse amplitude modulation. Example PAM symbols, signal levels, bit mappings, and aspects of data masking are described further with reference to FIGS. 3-10.

FIG. 3 illustrates at 300 an example of pulse amplitude modulation symbol bit mapping in accordance with one or more aspects. In aspects, various memory data of read operations or write operations may be converted from NRZ (binary) coded values to PAM3 (ternary) coded values or vice versa when switching between binary and PAM signaling for data transfer. With PAM3 signaling, a channel may transmit 1.5 data bits per cycle using three distinct signal levels. Each of these signal levels of the PAM3 signaling scheme may be referred to as a symbol, which is transmitted via a respective DQ line of the memory interconnect during a unit interval.

Generally, FIG. 3 illustrates an example mapping between NRZ encodings 302 that are suitable for communication via a 3-wire binary interface and PAM3 encodings 304 that are suitable for communication via a 2-wire tri-level interface. With reference to the binary values of the NRZ encodings 302, the zeros and one may represent respective logic high or logic low states (PAM2). The signal levels or symbols indicated for the PAM3 encodings 304 may correspond to the signaling states or symbols described with reference to FIGS. 2A and 2B for a high-level signal (H), a mid-level signal (H), and a low-level signal (L). In aspects, the PAM3 encodings 304 are representative of valid encodings in accordance with a memory specification, such as LPDDR6. As shown by the PAM3 encodings 304, the mapping or conversion of data bits from a binary interface to some PAM3 signaling scheme, however, does not fully utilize all available signaling states of the PAM signaling scheme or PAM symbol map. In some cases, the high-level/high-level (H/H) state 306 for two signal lines or a predefined pair of symbols may be prohibited or undefined for the memory interface.

In aspects of data masking for pulse amplitude modulation, this high-level/high-level (H/H) state 306 may be used (e.g., H/H=data masking enabled) by the data mask function 110 and/or data mask logic 122 to implement data masking for groups of data bits or burst lines written to the memory device. For example, the data mask function may alter a PAM symbol or signal level for one or more data lines from a low-voltage state (L) or mid-voltage state (M) state to a high-voltage state (H), resulting in a PAM signaling state (e.g., majority of H values) for the set of data lines that corresponds to an indication of data masking for the group data bits (e.g., a burst length of bits). Because some memory specifications prohibit or prevent high-level/high-level (H/H) states for pairs of data lines or for a majority of data lines within a set of DQ lines of an interconnect, aspects of data masking for pulse amplitude modulation may utilize such signaling conditions to indicate or implement data masking without a dedicated data mask line being included in a signaling interface between the memory controller and the memory device. By so doing, the data mask function provided by the described aspects may indicate data masking for the group of bits without a dedicated data mask signal line, which may enable improved per-line memory bandwidth.

Figure 4B:
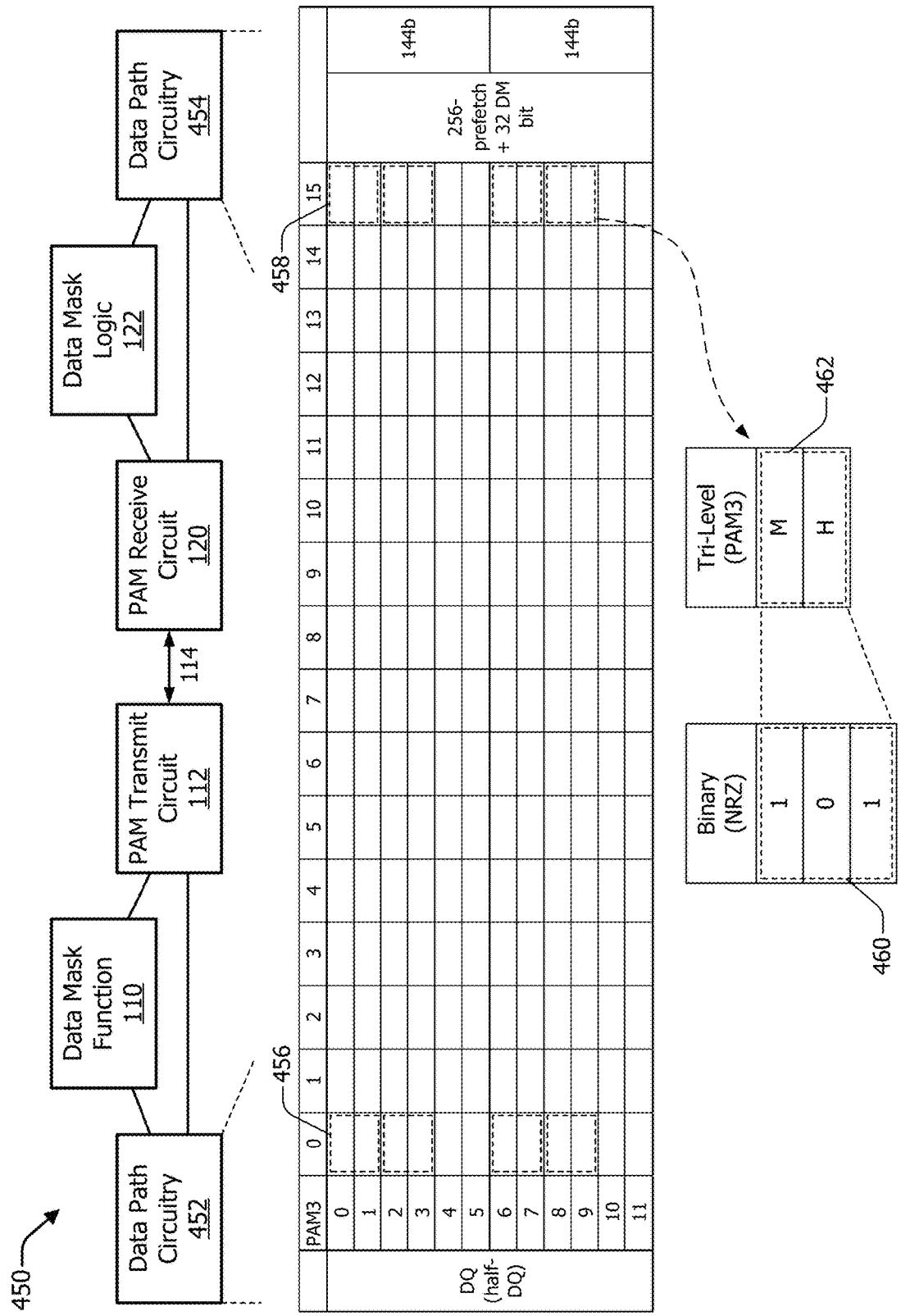
FIG. 4B illustrates an example pulse amplitude modulation symbol map for a burst write operation in accordance with one or more aspects.

To provide further detail in the context of a memory write operation, consider FIG. 4A, which illustrates at 400 an example binary signaling bit map with dedicated data mask bits for a burst write operation. In this example, the binary bit map at 400 is configured for NRZ signaling with a burst length (BL) of 16 for DQ[0:7] and DQ[8:15] with dedicated data mask/inversion lines (DMI) for each DQ byte/subset. Thus, the NRZ signaling bit map supports 288b with 18-DQ, including 256b for data with 32b (16b+16b) for data masking with independent pins. As shown at 400, groups of three DQ lines are illustrated for BL0 at 402 and BL15 at 404. As described with reference to FIG. 4B, these groupings of three binary DQ lines may be mapped to corresponding groups of two tri-level DQ lines for PAM3 signaling.

FIG. 4B illustrates an example pulse amplitude modulation symbol map for a burst write operation in accordance with one or more aspects. In this example, the PAM symbol map 450 may represent a data mapping implemented in association with or by respective logic of data path circuitry 452 (e.g., data write path) of a memory controller 108 (not shown) or data path circuitry 454 (e.g., data write circuitry) of a memory device 116 (not shown). The data path circuitry 452 or data path circuitry 454 may be implemented similar to or different from the data path circuitry as described with reference to FIG. 2A or 2B. As shown in FIG. 4B the data path circuitry of the memory controller 108 may be coupled with the data mask function 110 and the PAM transmit circuit 112 to enable aspects of data masking for pulse amplitude modulation. Likewise, the data path circuitry 454 of the memory device 116 may be coupled with the data mask logic 122 and the PAM receive circuit 120 to enable aspects of data masking for pulse amplitude modulation. Generally, the PAM symbol map 450 may represent a data structure or logic (e.g., I/O logic, encode array, decode array) of data path circuitry for implementing various memory operations with pulse amplitude modulation, which may include encoding, decoding, queueing, buffering, fetching, pre-fetching, transmitting, or receiving PAM symbols, multi-level signals, or data that corresponds to such symbols or signals.

As noted, groups or groupings of three binary DQ lines may be mapped or converted to corresponding groups of two tri-level DQ lines for PAM3 signaling as shown at 450 in FIG. 4B. In this example, a transfer of 256 bits may be implemented using PAM3 signaling with a burst length of 16 (BL=16). With reference to corresponding BLs of FIGS. 4A and 4B, the respective groups of three binary DQ lines 402 and 404 can be mapped or converted between the groups of two tri-level (H/M/L) DQ lines 456 and 458 at BL0 and BL15 of the illustrated bit map. As an example mapping, a three-wire binary representation of data bits at 460 may be mapped to a two-wire tri-level representation of symbols [M/H] at 462 (e.g., using the value tables of FIG. 3).

Thus, as illustrated in FIGS. 4A and 4B the encoding between binary and tri-level values may yield a 3:2 reduction in DQ lines. As noted, the H/H symbol state for pairs of tri-level DQ lines or symbol pairs may be unassigned or prohibited, and accordingly may be used by the data mask function 110 and/or data mask logic 122 to implement data masking when the memory controller 108 and memory device 116 operate using a PAM3 signaling mode. As such, whereas other implementations of PAM3 signaling may support 288b with 12-DQ, including 256b for data with 32b data masking, the described aspects enable the 32b assigned for data masking to be re-assigned for other uses, which may include error-correction coding syndrome or other uses. These are but a few examples of how aspects of data masking for pulse amplitude modulation may be implemented, which may improve bandwidth efficiency of a memory system.

FIG. 5 illustrates at 500 an example pulse amplitude modulation signal level map in which data masking can be implemented in accordance with one or more aspects. As described with reference to FIG. 3, the H/H symbol pair may be unassigned or prohibited in some PAM3 implementations. Aspects of data masking for pulse amplitude modulation can use this H/H symbol state or a number of H symbols to implement data masking for PAM3-enabled memory access. As shown at 500, tri-level DQ lines may be divided into subsets of six DQ lines or three pairs of DQ lines that convey six PAM3 symbols or signal level per unit interval or BL. Given that the H/H symbol state is not allowed for each pair of DQ lines, only three H symbols or H signal levels should be present per six DQ lines (e.g., DQ[0:5] or DQ[6:11]) for a given unit interval. Thus, aspects of data masking for pulse amplitude modulation may use a predefined number or threshold for H symbols to indicate (e.g., by the data mask function) and/or implement (e.g., by the data mask logic) data masking for PAM3 encoded data.

By way of example, the signal level map of FIG. 5 includes various PAM3 encoding values for BLs of data queued or fetched for a memory write operation. When the memory controller 108 enables data masking for a BL, the data mask function 110 can alter one or more PAM3 symbols or signal levels to provide at least 4 H symbols or H signal levels for a BL or unit interval. At 502, BL2 for DQ[0:5] includes four H symbols, which indicate at 504 that data masking is enabled on those DQ lines for BL2. As another example, at 506, BL0 for DQ[6:11] includes four H symbols, which indicate at 508 that data masking is enabled on those DQ lines for BL0. In some cases, data mask function 110 decreases signaling error margin by altering more than a minimum number of PAM3 symbols or signal levels. For example, when the channel quality is poor for one or more of DQ[0:5], the data mask function 110 may determine to use five PAM symbols or signal levels to indicate data masking to the memory device 116. For example, at 510, the data mask function 110 alters at least two symbols in DQ[6:11] to provide five H symbols to indicate at 512 that data masking is enabled on those DQ lines for BL0. In aspects, the data mask logic 122 of the memory device 116 may monitor DQ or subsets of DQ based on a DM configuration (e.g., DM H symbols threshold, sequence, or pattern) set by the memory controller 108 to implement data masking for pulse amplitude modulation.

In aspects, the memory controller 108 may select different configurations for the data mask function 110 to implement data masking for pulse amplitude modulation. The memory controller 108 may set or select a data masking configuration for all DQ lines or a subset of DQ lines, with each subset having same or different DM configurations. As shown in FIG. 5, the memory controller may select a configuration 521 to use a majority of H symbols to indicate data masking on DQ[0:5], or one of configurations 522, 523, or 524 to use four H symbols, five H symbols, or six H symbols, respectively. Likewise, the memory controller may select a configuration 531 to use a majority of H symbols to indicate data masking on DQ[6:11], or one of configurations 532, 533, or 534 to use four H symbols, five H symbols, or six H symbols, respectively. The memory controller 108 may select one DM configuration for the DQ or a subset of DQ based on any suitable condition or basis, such as channel noise, DQ calibration measurements, channel error rates, memory data rate, I/O line driver voltage, DQ termination settings, or the like.

FIG. 6 illustrates at 600 another example pulse amplitude modulation signal level map in which data masking can be implemented in accordance with one or more aspects. As described with reference to FIG. 3, the H/H symbol pair may be unassigned or prohibited in some PAM3 implementations. Aspects of data masking for pulse amplitude modulation can using this H/H symbol state or a number of H symbols to implement data masking for PAM3-enabled memory access. For the sake of brevity, tri-level DQ lines of the chart 600 may be divided into subsets of DQ lines as described with reference to FIG. 5 unless described otherwise.

In accordance with aspects described herein, the signal level map of FIG. 6 includes various PAM3 encoding values for BLs of data queued or fetched for a memory write operation. In this example, when the memory controller 108 enables data masking for a BL, the data mask function 110 can alter one or more PAM3 symbols or signal levels to provide H symbols or H signal levels for predefined pairs of DQ or symbol pairs for a BL or unit interval. At 602, the DQ[0:1] both H symbols, which indicates at 604 that data masking is enabled on that subset of DQ[0:5] for BL2. As another example, the data mask function 110 alters one or two PAM3 symbols at 606 to provide a pair of H symbols on DQ[0:1] for BL6. In some cases, data mask function 110 decreases signaling error margin by selecting to use different or specific pairs of DQ by which to indicate PAM3 symbols or signal levels for data masking.

For example, when the channel quality is poor for one pair of DQ[0:1], the data mask function 110 may determine to use another pair of DQ (e.g., DQ[2:3] or DQ[4:5]) to indicate data masking to the memory device 116. For example, at 606, the data mask function 110 configures the data mask logic to use DQ[2:3] for data masking. Here, the data mask function 110 alters two PAM3 symbols to provide a pair of H symbols at DQ[2:3] to indicate at 608 data masking to the data mask logic of the memory device. As another example, at 610, BL0 for DQ[6:11] includes a pair of H symbols at DQ[0:1], which indicate at 612 that data masking is enabled on those DQ lines for BL0. In aspects, the data mask logic 122 of the memory device 116 may monitor DQ or subsets of DQ based on a DM configuration (e.g., DM H symbol pairs) set by the memory controller 108 to implement data masking for pulse amplitude modulation.

In aspects, the memory controller 108 may select different configurations for the data mask function 110 to implement data masking for pulse amplitude modulation. The memory controller 108 may set or select a data masking configuration for all DQ lines or a subset of DQ lines, with each subset having same or different DM configurations. As shown in FIG. 6, the memory controller may select a configuration 621 to use a pair of H symbols set for a specific pair of DQ (e.g., DQ[0:1]) to indicate data masking on DQ[0:5], or one of configuration 622 or 623 to use a different pair of DQ or use those DQ for a function other than data masking. Likewise, the memory controller may select a configuration 631 to use a pair of H symbols set for a specific pair of DQ (e.g., DQ[6:7]) to indicate data masking on DQ[6:11], or one of configurations 632 or 633 to use a different pair of DQ or use those DQ for a function other than data masking. The memory controller 108 may select one DM configuration for the DQ or a subset of DQ based on any suitable condition or basis, such as channel noise, DQ calibration measurements, channel error rates, memory data rate, I/O line driver voltage, DQ termination settings, or the like.

In aspects, the configurations described with reference to FIG. 6 may less complex to implement with the data mask function and/or data mask logic functions directed to specific or particular pairs of DQs. In some cases, the configurations described with reference to FIG. 5 may provide more margin for channel error by using or altering a greater number of H symbols. Generally, the described aspects use predefined PAM3 symbol states to implement data masking, which may obviate a need to use dedicated data masking/inversion (DMI) lines of the interconnect. Thus, the redundant DMI lines, which may include the "(16b+16b)" out of "288b" as described with reference to FIG. 4A may be used for other purposes, such as ECC bits or additional data.

Example Methods

Example methods 700, 800, 900, and 1000 for data masking for pulse amplitude modulation are described in this section with reference to the flow charts and flow diagrams of FIGS. 7-10. These descriptions reference components, entities, and other aspects depicted in FIGS. 1-6 by way of example only. The described acts of the methods may be performed using any suitable circuitry or component, such as the components, entities, and other aspects depicted in FIGS. 1-6, which may provide means for implementing one or more of the operations described with reference to the methods of FIGS. 7-10.

Figure 7:
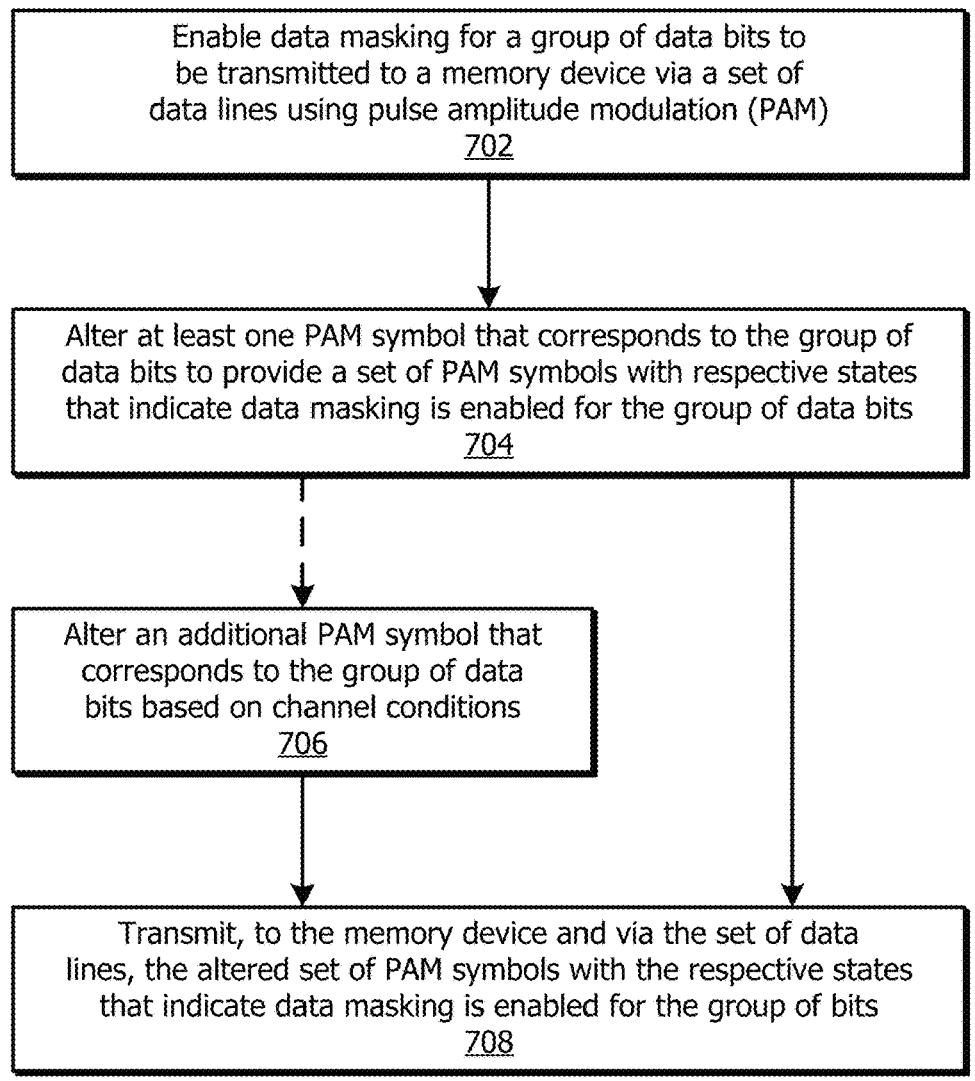
FIG. 7 illustrates an example method for altering a pulse amplitude modulation symbol to indicate data masking for a group of data bits in accordance with one or more aspects.

FIG. 7 depicts a flow diagram 700 of an example method for altering a pulse amplitude modulation symbol to indicate data masking for a group of data bits in accordance with one or more aspects. The flow diagram 700 includes operations 702 through 708, which may be performed using a data mask function 110 or data mask logic 122 to implement aspects of data masking for pulse amplitude modulation as described herein.

At 702, a memory controller enables data masking for a group of data bits to be transmitted to a memory device. The group of data bits may be encoded, queued, and/or scheduled for transmission to the memory device via a set of data lines using pulse amplitude modulation. In some cases, the memory controller determines to enable data masking for the group of bits, which may not have changed in value since a preceding command access cycle. In other words, the memory controller may use data masking to prevent the overwriting of bits, bytes, or other data groups that should not be altered during a pending or current memory write operation (e.g., to implement a partial write operation that does not overwrite every byte, group, line, row, bank, or other logical access unit of a memory array).

At 704, a data mask function of the memory controller alters at least one of a set of PAM symbols that correspond to the group of data bits to provide an altered set of PAM symbols with respective states that indicate data masking is enabled for the group of data bits. For example, the data mask function may change two PAM symbols from low-level or mid-level states to high-level states such that more than half of the PAM symbols of the set of PAM symbols have respective high-level states.

Optionally at 706, the data mask function alters an additional one of the set of PAM symbols that correspond to the group of data bits based on channel conditions. In some cases, the memory controller performs a calibration or measurement of a DQ channel to determine an amount of noise or distortion present in the channel. The memory controller may compare level of noise to one or more thresholds to determine a number of additional PAM symbols to alter. Alternatively, when a subset of DQ lines are more susceptible to errors, the data mask function may avoid altering PAM symbols associated with those DQ lines with indicating data masking for a group of data bits.

At 708, the memory controller transmits, to the memory device and via the set of data lines, the altered set of PAM symbols with the respective states that indicate data masking is enabled for the group of data bits. By so doing, the data mask function may indicate to enable data masking based on H/H states of the PAM symbols instead of using a dedicated or separate data masking line.

Figure 8:
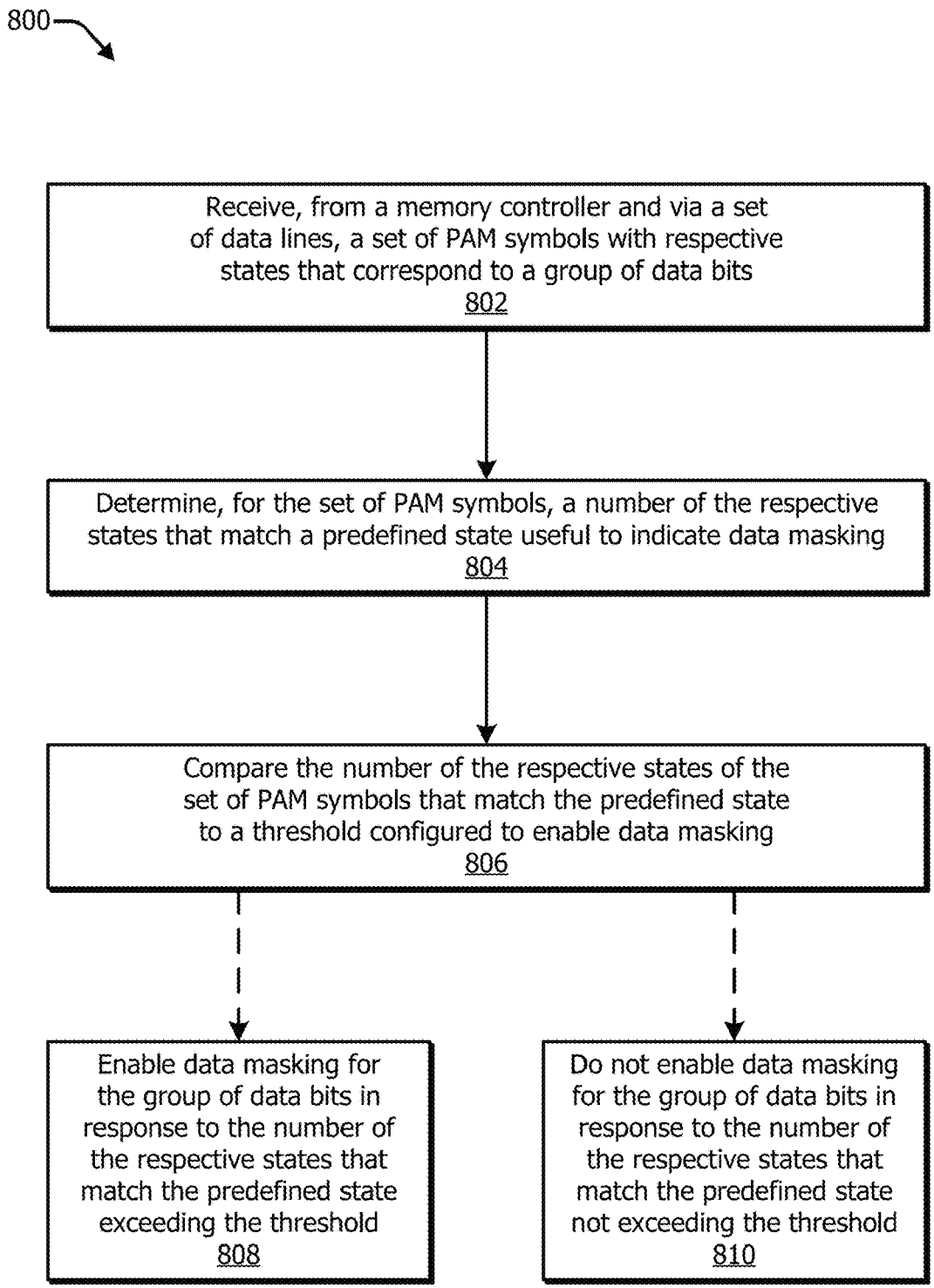
FIG. 8 illustrates an example method for implementing data masking for a group of data bits based on respective states of multiple pulse amplitude modulation symbols in accordance with one or more aspects.

FIG. 8 depicts a flow diagram 800 of an example method for implementing data masking for a group of data bits based on respective signal levels of multiple pulse amplitude modulation signals in accordance with one or more aspects. The flow diagram 800 includes operations 802 through 810, which may be performed using a data mask function 110 or data mask logic 122 to implement aspects of data masking for pulse amplitude modulation as described herein.

At 802, a memory device receives, from a memory controller and via a set of data lines, a set of PAM symbols with respective states indicative of a group of data bits. The set of PAM symbols may be encoded with tri-level pulse amplitude modulation (PAM3). The set of data lines may comprise one half of a DQ bus configured for PAM3 signaling. The group of data bits may correspond to data received during one clock cycle, one unit interval, or burst length.

At 804, data mask logic of the memory device determines a number of the PAM symbols that have a predefined state useful to indicate data masking. In aspects, the data mask logic may determine how many PAM symbols or signal levels are high-level. Alternatively, the data mask logic may be configured to implement data masking with other states of the PAM symbols.

At 806, the data mask logic compares the number of PAM symbols that have the predefined state to a threshold for data masking. The threshold may be configured to enable data masking based on a number of PAM symbols have a predefined state. For example, the data mask logic may compare the number of PAM symbols having a high-level state with a threshold based on DQ pairings (e.g., a 50% threshold for DQ pairs typically prohibited from H/H states).

Optionally at 808, the data mask logic enables data masking for the group of data bits in response to the number of PAM symbols that have the predefined state exceeding the threshold. For example, when more than half of the PAM symbols have a high-level state, the data mask logic may enable or trigger data masking for the group of data bits written to the memory device. Optionally at 810, the data mask logic does not enable data masking for the group of data bits in response to the number of PAM symbols that have the predefined state not exceeding the threshold.

Figure 9:
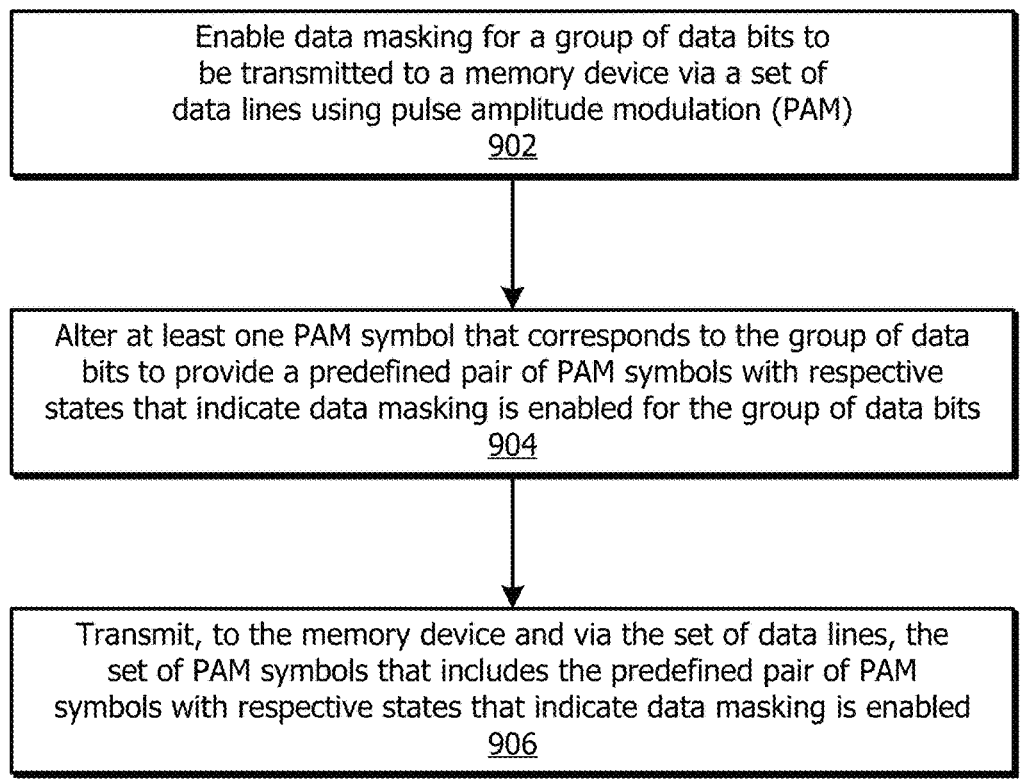
FIG. 9 illustrates an example method for indicating data masking based on a pair of pulse amplitude modulation symbols in accordance with one or more aspects.

FIG. 9 depicts a flow diagram 900 of an example method for indicating data masking based on a pair of pulse amplitude modulation symbols in accordance with one or more aspects. The flow diagram 900 includes operations 902 through 906, which may be performed using a data mask function 110 or data mask logic 122 to implement aspects of data masking for pulse amplitude modulation as described herein.

At 902, a memory controller enables data masking for a group of data bits to be transmitted to a memory device via a set of data lines using PAM. In some cases, the memory controller determines to enable data masking for the group of bits, which may not have changed in value since a preceding command access cycle. In other words, the memory controller may use data masking to prevent the overwriting of bits, bytes, or other data groups that should not be altered during a pending or current memory write operation.

At 904, a data mask function of the memory controller alters at least one PAM symbol that corresponds to the group of data bits to provide a predefined pair of PAM symbols with respective states that indicate data masking is enabled for the group of data bits. The predefined pair of PAM symbols may be defined based on or correlate with a pair of DQ lines, positions, or ordering. The predefined PAM symbols or DQ lines may be adjacent or non-adjacent, which may prevent signal integrity issues from affecting both PAM symbols or DQ lines of the pair.

At 906, the memory controller transmits, to the memory device and via the set of data lines, the set of PAM symbols that include the predefined pair of PAM symbols with respective states that indicate data masking is enabled. By so doing, the data mask function may indicate to enable data masking based on H/H states of the pair of PAM symbols or DQ lines instead of using a dedicated or separate data masking line.

Figure 10:
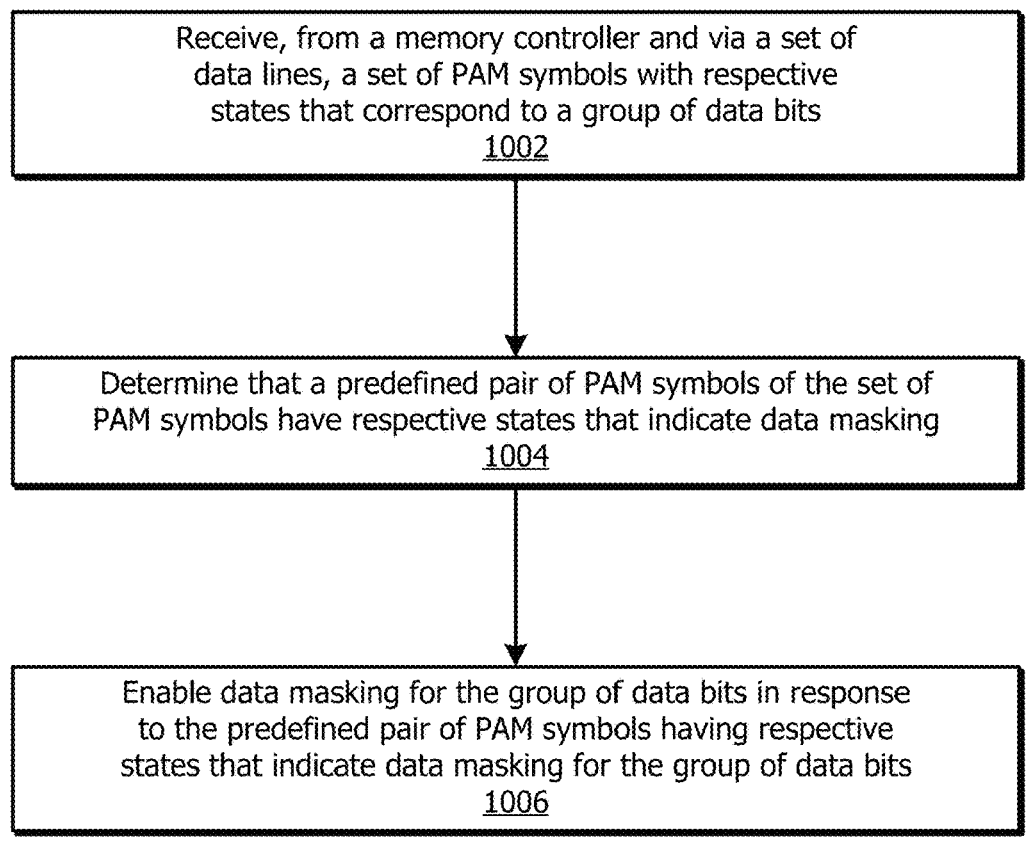
FIG. 10 illustrates an example for implementing data masking based on respective states of a pair of pulse amplitude modulation symbols in accordance with one or more aspects.

FIG. 10 depicts a flow diagram 1000 of an example method for implementing data masking based on respective states of a pair of pulse amplitude modulation symbols in accordance with one or more aspects. The flow diagram 1000 includes operations 1002 through 1006, which may be performed using a data mask function 110 or data mask logic 122 to implement aspects of data masking for pulse amplitude modulation as described herein.

At 1002, a memory device receives, from a memory controller and via a set of data lines, a set of PAM symbols with respective states indicative of a group of data bits. The group of data bits may correspond to data received during one clock cycle, one unit interval, or burst length.

At 1004, data mask logic of the memory device determines that a predefined pair of PAM symbols of the set of PAM symbols have a respective states that indicate data masking. In aspects, the data mask logic may determine that a pair of PAM symbols or signal levels are high-level. Alternatively, the data mask logic may be configured to implement data masking with other states of the PAM symbols or combinations thereof.

At 1006, the data mask logic enables data masking for the group of data bits in response to the predefined pair of PAM symbols having respective states that indicate data masking for the group of data bits. By so doing, the data mask logic may enable data masking without monitoring a separate or dedicated data mask signal line of the memory interconnect.

For the flow charts and flow diagrams described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods or operations may be implemented in, for example, hardware (e.g., fixed-logic circuitry or a processor in conjunction with a memory), firmware, or some combination thereof. The methods may be realized using one or more of the apparatuses, systems, configurations, or components shown in FIGS. 1-6, the components of which may be further divided, combined, rearranged, and so on. The devices, systems, and components of these figures generally represent firmware, such as executable-code or the actions thereof; hardware, such as electronic devices, packaged modules, IC chips, or circuits; software, such as processor-executable instructions; or a combination thereof. The illustrated apparatuses 100 and components shown at 200, and/or 300, include, for instance, a memory controller 108, a data mask function 110, a PAM transmit circuit 112, an interconnect 114, a memory device 116, a PAM receive circuit 120, data mask logic 122, and a memory die 124. An apparatus 102 can include a processor 106 and a memory controller 108. A memory device 116 may include a mode register 118, PAM receive circuit 120, a data mask logic 122, and memory die 124. An instance of the memory controller 108 or the memory device 116 may include multiple power supplies, a power distribution network (PDN) to provide power at multiple respective voltage levels, and one or more pull-up drivers, pull-down drivers, and/or on-die terminations to enable aspects of data masking for pulse amplitude modulation or other signaling modes. Thus, these figures illustrate some of the many possible systems or apparatuses capable of implementing the described methods.

In the following, various examples for implementing data masking with pulse amplitude modulation (PAM) encoded signals of a memory circuit are described:

Example 1: An apparatus comprising: an interface for a memory interconnect; data path circuitry configured to: implement pulse amplitude modulation (PAM) signaling for data written to or read from memory via the interface, and implement a data mask function that is configured to: enable data masking for a group of data bits to be transmitted via a set of data lines of the memory interconnect using the PAM signaling; alter at least one PAM symbol of a set of PAM symbols that corresponds to the group of data bits to provide an altered set of PAM symbols with respective states that indicate data masking is enabled for the group of data bits; and transmit, via the set of data lines of the memory interconnect, the altered set of PAM symbols with the respective states that indicate data masking is enabled for the group of data bits.

Example 2: The apparatus recited in example 1 or any other example, wherein: the altered set of PAM symbols are transmitted to a memory device coupled to the memory interconnect; and the altered set of PAM symbols causes the memory device to implement data masking for the group of data bits.

Example 3: The apparatus recited in example 1 or any other example, wherein: the set of data lines comprises a subset of a plurality of data lines of the memory interconnect; and during the transmission of the altered set of PAM symbols, the data mask function is further configured to refrain from asserting a separate data mask signal of the memory interconnect for the group of data bits.

Example 4: The apparatus recited in example 1 or any other example, wherein: the pulse amplitude modulation signaling comprises three-level pulse amplitude modulation (PAM3) and the data mask function is further configured to: alter the at least one PAM symbol by changing a low-level PAM3 symbol to a high-level PAM3 symbol; or alter the at least one PAM symbol by changing a mid-level PAM3 symbol to a high-level PAM3 symbol.

Example 5: The apparatus recited in example 4 or any other example, wherein the data mask function is further configured to: alter the at least one PAM symbol such that the altered set of PAM symbols includes a pair of high-level PAM3 symbols that indicate data masking is enabled; or alter the at least one PAM symbol such that the altered set of PAM symbols includes high-level PAM3 symbols that correspond to a predefined pair of the set of data lines to indicate that data masking is enabled.

Example 6: The apparatus as recited in example 4 or any other example, wherein the data mask function is further configured to alter the at least one PAM symbol such that the altered set of PAM symbols includes a majority number of high-level PAM symbols to indicate that data masking is enabled.

Example 7: The apparatus as recited in example 4 or any other example, wherein the data mask function is further configured to alter the at least one PAM symbol such that the altered set of PAM symbols includes a majority plus one number of high-level PAM symbols to indicate that data masking is enabled.

Example 8: The apparatus as recited in example 4 or any other example, wherein the data mask function is further configured to alter the at least one PAM symbol such that the altered set of PAM symbols includes a majority plus two number of high-level PAM symbols to indicate that data masking is enabled.

Example 9: The apparatus as recited in example 1 or any other example, wherein the data mask function is further configured to: determine channel conditions for the set of data lines by which the altered set of PAM symbols are to be transmitted; and alter at least one additional PAM symbol in the altered set of PAM symbols based on the channel conditions.

Example 10: The apparatus as recited in example 1 or any other example, wherein the set of data lines of the memory interconnect comprise six data lines configured to convey six respective PAM symbols that encode a byte of data.

Example 11: The apparatus as recited in example 1 or any other example, wherein the data path circuitry comprises a transmit circuit configured to implement single-voltage PAM signaling or dual-voltage PAM signaling.

Example 12: A method comprising: enabling data masking for a group of data bits to be transmitted, during a clock cycle, to a memory device via a set of data lines using pulse amplitude modulation (PAM); altering at least one PAM symbol of a set of PAM symbols that corresponds to the group of data bits to provide an altered set of PAM symbols with respective states that indicate data masking is enabled for the group of data bits; and transmitting, via the set of data lines and during the clock cycle, the altered set of PAM symbols to the memory device with the respective states that indicate data masking is enabled for the group of data bits.

Example 13: The method as recited by example 12 or any other example, wherein transmission of the altered set of PAM symbols causes the memory device to implement data masking for the group of data bits.

Example 14: The method as recited by example 12 or any other example, wherein: the set of data lines comprises a subset of a plurality of data lines of a memory interconnect; and during the clock cycle, the plurality of lines of the memory interconnect do not carry a separate data mask signal for the group of data bits that correspond to the altered set of PAM symbols.

Example 15: The method as recited by example 12 or any other example, wherein: the pulse amplitude modulation is three-level pulse amplitude modulation (PAM3); and altering the at least one PAM symbol comprises one of: changing a low-level PAM3 symbol to a high-level PAM3 symbol; or changing a mid-level PAM3 symbol to a high-level PAM3 symbol.

Example 16: The method as recited in example 15 or any other example, further comprising: altering the at least one PAM symbol such the altered set of PAM symbols includes a pair of high-level PAM3 symbols that indicate data masking is enabled; or altering the at least one PAM symbol such that the altered set of PAM symbols includes high-level PAM3 symbols that correspond to a predefined pair of the set of data lines to indicate that data masking is enabled.

Example 17: The method as recited by example 15 or any other example, further comprising altering the at least one PAM symbol such the altered set of PAM symbols include a majority number of high-level PAM symbols to indicate that data masking is enabled.

Example 18: The method as recited by example 15 or any other example, further comprising altering the at least one PAM symbol such the altered set of PAM symbols include a majority plus one number of high-level PAM symbols to indicate that data masking is enabled.

Example 19: The method as recited by example 15 or any other example, further comprising altering the at least one PAM symbol such the altered set of PAM symbols include a majority plus two number of high-level PAM symbols to indicate that data masking is enabled.

Example 20: The method as recited by example 12 or any other example, further comprising: determining channel conditions for the set of data lines by which the altered set of PAM symbols are to be transmitted; and altering at least one additional PAM symbol in the altered set of PAM symbols based on the channel conditions.

Example 21: The method as recited by example 12 or any other example, wherein the clock cycle corresponds to a burst length for the group of data bits or set of PAM symbols.

Example 22: The method as recited by example 12 or any other example, wherein the set of data lines comprises six data lines configured to convey six PAM symbols that encode a byte of data.

Example 23: The method as recited by example 12 or any other example, further comprising transmitting the altered set of PAM symbols using single-voltage PAM signaling or dual-voltage PAM signaling.

Example 24: An apparatus comprising: an interface for a memory interconnect; data path circuitry configured to: implement pulse amplitude modulation (PAM) signaling for data written to or data read from memory via the interface, and data mask logic that is configured to: receive, via a set of data lines of the memory interconnect, a set of PAM symbols with respective states that correspond to a group of data bits; determine, for the set of PAM symbols, a number of the respective states that match a predefined state useful to indicate data masking; compare the number of the respective states of the set of PAM symbols that match the predefined state to a data masking threshold; and enable data masking for the group of data bits in response to the number of the respective states that match the predefined state exceeding the threshold.

Example 25: The apparatus recited in example 24 or any other example, wherein: the set of data lines comprises a subset of a plurality of data lines of the memory interconnect; and during the reception of the set of PAM symbols, a separate data mask signal of the interconnect for the group of data bits is not asserted.

Example 26: The apparatus recited in example 24 or any other example, wherein: the pulse amplitude modulation signaling comprises three-level pulse amplitude modulation (PAM3); and the predefined state useful to indicate data masking is a high-level PAM3 state.

Example 27: The apparatus recited in example 26 or any other example, wherein the data mask logic is further configured to: determine, for a predefined pair of the PAM symbols, the number of the respective states that match a predefined state useful to indicate data masking; compare the number of the respective states of the predefined pair of the PAM symbols that are high-level PAM3 states with a threshold of two PAM symbols; and enable data masking for the group of data bits in response to the respective states of both of the predefined pair of the PAM symbols being high-level PAM3 states.

Example 28: The apparatus as recited in example 26 or any other example, wherein the data masking threshold is configured to enable data masking when: a majority number of the PAM symbols of the set of PAM symbols are high-level PAM3 symbols; a majority plus one number of the PAM symbols of the set of PAM symbols are high-level PAM3 symbols; or a majority plus two number of the PAM symbols of the set of PAM symbols are high-level PAM3 symbols.

Example 29: The apparatus as recited in example 24 or any other example, wherein the set of data lines of the memory interconnect comprise six data lines configured to convey six respective PAM symbols that encode a byte of data.

Example 30: The apparatus as recited in example 24 or any other example, wherein the data path circuitry comprises a transmit circuit configured to implement single-voltage PAM signaling or dual-voltage PAM signaling.

Example 31: The apparatus as recited in example 24 or any other example, wherein the data path circuitry comprises a transmit circuit configured to implement single-voltage PAM signaling or dual-voltage PAM signaling.

Example 32: A method comprising: receiving, via a set of data lines and during a clock cycle, a set of pulse amplitude modulation symbols from a memory controller with respective states that correspond to a group of data bits; determining, for the set of PAM symbols, a number of the respective states that match a predefined state useful to indicate data masking; comparing the number of the respective states of the set of PAM symbols that match the predefined state to a data masking threshold; and enabling data masking for the group of data bits in response to the number of the respective states that match the predefined state exceeding the threshold.

Example 33: The method as recited by example 32 or any other example, wherein: the set of data lines comprises a subset of a plurality of data lines of the memory interconnect; and during the reception of the set of PAM symbols, a separate data mask signal for the group of data bits is not received during the clock cycle.

Example 34: The method as recited by example 32 or any other example, wherein: the pulse amplitude modulation of the PAM symbols comprises three-level pulse amplitude modulation (PAM3); and the predefined state useful to indicate data masking is a high-level PAM3 state.

Example 35: The method as recited by example 34 or any other example, further comprising: determining, for a predefined pair of the PAM symbols, the number of the respective states that match a predefined state useful to indicate data masking; comparing the number of the respective states of the predefined pair of the PAM symbols that are high-level PAM3 states with a threshold of two PAM symbols; and enabling data masking for the group of data bits in response to the respective states of both of the predefined pair of the PAM symbols being high-level PAM3 states.

Example 36: The method as recited by example 34 or any other example, wherein the data masking threshold is configured to enable data masking when: a majority number of the PAM symbols of the set of PAM symbols are high-level PAM3 symbols; a majority plus one number of the PAM symbols of the set of PAM symbols are high-level PAM3 symbols; or a majority plus two number of the PAM symbols of the set of PAM symbols are high-level PAM3 symbols.

Example 37: The method as recited by example 32 or any other example, wherein the clock cycle corresponds to a burst length for the group of data bits or set of PAM symbols.

Example 38: The method as recited by example 32 or any other example, wherein the set of data lines comprises six data lines configured to convey six PAM symbols that encode a byte of data.

Example 39: The method as recited by example 32 or any other example, further comprising receiving the set of PAM symbols using single-voltage PAM signaling or dual-voltage PAM signaling.

In the context of the present disclosure, computer-readable media includes both non-transitory computer storage media and communication media, including any medium that facilitates transfer of a computer program (e.g., an application) or data from one entity to another. Non-transitory computer storage media can be any available medium accessible by a computer, such as RAM, SRAM, DRAM, ROM, Flash, EEPROM, optical media, and magnetic media.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of data masking for pulse amplitude modulation have been described in language specific to certain features and/or methods, the subject matter of the appended claims is not necessarily limited to the specific features or methods described. Rather, the specific features and methods are disclosed as a variety of example implementations of data masking for pulse amplitude modulation.

What is claimed is:

1. An apparatus comprising:
an interface for a memory interconnect;
data path circuitry configured to:
implement pulse amplitude modulation (PAM) signaling for data written to or data read from memory via the interface, and
data mask logic that is configured to:
receive, via a set of data lines of the memory interconnect, a set of PAM symbols with respective states that correspond to a group of data bits;
determine, for the set of PAM symbols, a number of the respective states that match a predefined state useful to indicate data masking;
compare the number of the respective states of the set of PAM symbols that match the predefined state to a data masking threshold; and
enable data masking for the group of data bits in response to the number of the respective states that match the predefined state exceeding the data masking threshold.

2. The apparatus recited in claim 1, wherein:
the set of data lines comprises a subset of a plurality of data lines of the memory interconnect; and
during reception of the set of PAM symbols, a separate data mask signal of the memory interconnect for the group of data bits is not asserted.

3. The apparatus recited in claim 1, wherein:
the pulse amplitude modulation signaling comprises three-level pulse amplitude modulation (PAM3); and
the predefined state useful to indicate data masking is a high-level PAM3 state.

4. The apparatus recited in claim 3, wherein the data mask logic is further configured to:
determine, for a predefined pair of the PAM symbols, the number of the respective states that match a predefined state useful to indicate data masking;
compare the number of the respective states of the predefined pair of the PAM symbols that are high-level PAM3 states with a threshold of two PAM symbols; and
enable data masking for the group of data bits in response to the respective states of both of the predefined pair of the PAM symbols being high-level PAM3 states.

5. The apparatus as recited in claim 3, wherein the data masking threshold is configured to enable data masking when:
a majority number of the PAM symbols of the set of PAM symbols are high-level PAM3 symbols;
a majority plus one number of the PAM symbols of the set of PAM symbols are high-level PAM3 symbols; or
a majority plus two number of the PAM symbols of the set of PAM symbols are high-level PAM3 symbols.

6. The apparatus as recited in claim 1, wherein the set of data lines of the memory interconnect comprises six data lines configured to convey six respective PAM symbols that encode a byte of data.

7. The apparatus as recited in claim 1, wherein the data path circuitry comprises a receive circuit configured to implement single-voltage PAM signaling or dual-voltage PAM signaling.

8. The apparatus as recited in claim 1, wherein the data mask logic is further configured to receive the set of PAM symbols during a clock cycle of the data path circuitry.

9. The apparatus as recited in claim 8, wherein the clock cycle corresponds to a burst length for the group of data bits or set of PAM symbols.

10. A method comprising:
receiving, via a set of data lines and during a clock cycle, a set of pulse amplitude modulation (PAM) symbols from a memory controller with respective states that correspond to a group of data bits;
determining, for the set of PAM symbols, a number of the respective states that match a predefined state useful to indicate data masking;
comparing the number of the respective states of the set of PAM symbols that match the predefined state to a data masking threshold; and
enabling data masking for the group of data bits in response to the number of the respective states that match the predefined state exceeding the data masking threshold.

11. The method as recited in claim 10, wherein:
the set of data lines comprises a subset of a plurality of data lines of a memory interconnect; and
during reception of the set of PAM symbols, a separate data mask signal for the group of data bits is not received during the clock cycle.

12. The method as recited in claim 10, wherein:
the pulse amplitude modulation of the PAM symbols comprises three-level pulse amplitude modulation (PAM3); and
the predefined state useful to indicate data masking is a high-level PAM3 state.

13. The method as recited in claim 12, further comprising:
determining, for a predefined pair of the PAM symbols, the number of the respective states that match a predefined state useful to indicate data masking;
comparing the number of the respective states of the predefined pair of the PAM symbols that are high-level PAM3 states with a threshold of two PAM symbols; and
enabling data masking for the group of data bits in response to the respective states of both of the predefined pair of the PAM symbols being high-level PAM3 states.

14. The method as recited in claim 12, wherein the data masking threshold is configured to enable data masking when:
a majority number of the PAM symbols of the set of PAM symbols are high-level PAM3 symbols;
a majority plus one number of the PAM symbols of the set of PAM symbols are high-level PAM3 symbols; or
a majority plus two number of the PAM symbols of the set of PAM symbols are high-level PAM3 symbols.

15. The method as recited in claim 10, wherein the clock cycle corresponds to a burst length for the group of data bits or set of PAM symbols.

16. The method as recited in claim 10, wherein the set of data lines comprises six data lines configured to convey six PAM symbols that encode a byte of data.

17. The method as recited in claim 10, further comprising receiving the set of PAM symbols using single-voltage PAM signaling or dual-voltage PAM signaling.

18. An apparatus comprising:
an interface for a memory interconnect;
data path circuitry configured to implement pulse amplitude modulation (PAM) signaling for data written to or data read from memory via the interface; and
means for:
receiving, via a set of data lines of the memory interconnect, a set of PAM symbols with respective states that correspond to a group of data bits;
determining, for the set of PAM symbols, a number of the respective states that match a predefined state useful to indicate data masking;
comparing the number of the respective states of the set of PAM symbols that match the predefined state to a data masking threshold; and
enabling data masking for the group of data bits in response to the number of the respective states that match the predefined state exceeding the data masking threshold.

19. The apparatus as recited in claim 18, wherein:
the set of data lines comprises a subset of a plurality of data lines of the memory interconnect; and
during reception of the set of PAM symbols, a separate data mask signal of the memory interconnect for the group of data bits is not asserted.

20. The apparatus as recited in claim 18, wherein:
the pulse amplitude modulation signaling comprises three-level pulse amplitude modulation (PAM3); and
the predefined state useful to indicate data masking is a high-level PAM3 state.

* * * * *